United States Patent
Ueta et al.

(10) Patent No.: US 7,462,882 B2
(45) Date of Patent: Dec. 9, 2008

(54) NITRIDE SEMICONDUCTOR LIGHT-EMITTING DEVICE, METHOD OF FABRICATING IT, AND SEMICONDUCTOR OPTICAL APPARATUS

(75) Inventors: Yoshihiro Ueta, Yamatokoriyama (JP); Teruyoshi Takakura, Tenri (JP); Takeshi Kamikawa, Mihara (JP); Yuhzoh Tsuda, Sakurai (JP); Shigetoshi Ito, Shijonawate (JP); Takayuki Yuasa, Ikoma-Gun (JP); Mototaka Taneya, Nara (JP); Kensaku Motoki, Mino (JP)

(73) Assignees: Sharp Kabushiki Kaisha, Osaka (JP); Sumitomo Electric Industries, Ltd., Osaka (JP)

( * ) Notice: Subject to any disclaimer, the term of this patent is extended or adjusted under 35 U.S.C. 154(b) by 21 days.

(21) Appl. No.: 10/831,659

(22) Filed: Apr. 26, 2004

(65) Prior Publication Data
US 2005/0141577 A1 Jun. 30, 2005

(30) Foreign Application Priority Data
Apr. 24, 2003 (JP) ............................ 2003-119334
Aug. 1, 2003 (JP) ............................ 2003-284745

(51) Int. Cl.
*H01L 27/15* (2006.01)
(52) U.S. Cl. ................. 257/103; 257/94; 257/E33.001; 372/43.01
(58) Field of Classification Search ................ 257/94, 257/103; 372/43.01
See application file for complete search history.

(56) References Cited

U.S. PATENT DOCUMENTS

| 2004/0041156 A1 * | 3/2004 | Tsuda et al. ................... 257/79 |
| 2005/0042787 A1 | 2/2005 | Ito et al. |

FOREIGN PATENT DOCUMENTS

| EP | 1304749 | * | 4/2003 |
| JP | 2000223743 | * | 1/1999 |
| JP | 2000-82676 | | 3/2000 |
| JP | 2000-164929 | | 6/2000 |
| JP | 200223743 | * | 8/2000 |
| JP | 2001-148532 | | 5/2001 |
| JP | 2001-160539 | | 6/2001 |
| JP | 2002-158405 | | 5/2002 |
| JP | 2003-037288 | | 2/2003 |
| JP | 2003-124115 | | 4/2003 |

(Continued)

*Primary Examiner*—Bradley W. Baumeister
*Assistant Examiner*—Matthew L Reames
(74) *Attorney, Agent, or Firm*—Morrison & Foerster LLP

(57) ABSTRACT

A nitride semiconductor laser device has a nitride semiconductor substrate that includes a dislocation-concentrated region 102 and a wide low-dislocation region and that has the top surface thereof slanted at an angle in the range of 0.3° to 0.7° relative to the C plane and a nitride semiconductor layer laid on top thereof. The nitride semiconductor layer has a depression immediately above the dislocation-concentrated region, and has, in a region thereof other than the depression, a high-quality quantum well active layer with good flatness and without cracks, a layer that, as is grown, readily exhibits p-type conductivity, and a stripe-shaped laser light waveguide region. The laser light waveguide region is formed above the low-dislocation region. This helps realize a nitride semiconductor laser device that offers a longer life.

6 Claims, 15 Drawing Sheets

FOREIGN PATENT DOCUMENTS

| | | | |
|---|---|---|---|
| JP | 2003-124572 | | 4/2003 |
| JP | 2003-124573 | | 4/2003 |
| JP | 2003124115 | * | 4/2003 |
| JP | 2004-88134 | | 3/2004 |
| WO | WO02065556 | * | 8/2002 |

* cited by examiner

NITRIDE SEMICONDUCTOR LIGHT-EMITTING DEVICE, METHOD OF FABRICATING IT, AND SEMICONDUCTOR OPTICAL APPARATUS

BACKGROUND OF THE INVENTION

1. Field of the Invention

The present invention relates to a nitride semiconductor light-emitting device such as a nitride semiconductor laser device, to a method of fabrication thereof, and to a semiconductor optical device provided with a nitride semiconductor laser device as a light source.

2. Description of the Prior Art

There have been test-fabricated semiconductor laser devices that lase in an ultraviolet to visible region of the spectrum by using nitride semiconductor materials as exemplified by GaN, AlN, InN, and compound crystals thereof. An example of such a semiconductor laser device is reported in Japanese Journal of Applied Physics, Vol. 39 (2000), pp. L647-650. According to this document, a nitride semiconductor laser device is formed on top of a GaN substrate in the following manner. First, on top of the GaN substrate, an $SiO_2$ mask pattern is formed that has stripe-shaped openings formed periodically therein, and then, further on top thereof, a layered structure of a nitride semiconductor is formed that has stripe-shaped waveguides (ridge-stripe structures).

The substrate is reported to be fabricated through the following procedure. On primer GaN having a $SiO_2$ mask pattern formed thereon, the $SiO_2$ mask pattern having stripe-shaped openings formed periodically therein (with a period of 20 μm), a 15 μm thick GaN layer is formed by MOCVD (metalorganic chemical vapor deposition) to produce a wafer with a flat surface. This is a technique called ELOG (epitaxially lateral overgrown), which exploits lateral growth to reduce defects. Further on top, a 200 μm thick GaN layer is formed by common HVPE (hydride vapor phase epitaxy), and then the primer is removed. Now, the fabrication of a GaN substrate is complete. A semiconductor laser as actually produced in this way was estimated to have a life of 15,000 hours at 60° C. and at 30 mW.

One disadvantage of the semiconductor laser device described in the document mentioned above is that the fabrication procedure thereof involves three sessions of crystal growth (primer growth, MOCVD growth, and HVPE growth), and is thus complicated, resulting in unsatisfactory productivity. Another disadvantage is an unsatisfactory laser oscillation life, in particular under high-temperature, high-output conditions (for example, at 70° C. and at 60 mW).

As is the case in the example described in the document mentioned above, typically used as substrates are GaN substrates, which have therefore been researched intensively in many research institutions. However, to date, no semiconductor laser devices have been obtained that offer satisfactorily long lives, and therefore longer lives are now being sought in semiconductor laser devices. It is known that the life of a semiconductor laser device depends heavily on the density of defects (in the present specification, defects denote atomic vacancies, interstitial atoms, dislocations, and the like) inherent in a GaN substrate. However, substrates with low defect density are difficult to produce, albeit said to be effective in achieving longer lives, and have thus been researched eagerly.

For example, Japanese Patent Application Laid-Open No. 2000-223743 discloses a method of producing a nitride semiconductor light-emitting device structure on the top surface of a GaN substrate which is slanted relative to the C plane. This helps to reduce lattice defects in the nitride semiconductor layer formed on the GaN substrate and thereby to achieve a longer useful live.

However, it has been suggested that, with conventional nitride semiconductor laser devices like the one disclosed in Japanese Patent Application Laid-Open No. 2000-223743, it is impossible to obtain satisfactorily long lives when they are subjected to high-output aging over a wide area (or the whole area) on the produced substrate. Moreover, no mention is made of variations in characteristics among individual devices obtained after separation into discrete chips.

As described above, using a nitride semiconductor substrate having a laser structure produced by a conventional crystal growth technique often results in an unsatisfactory life, or in a lower yield rate due to variations in the characteristics of chips.

SUMMARY OF THE INVENTION

In view of the problems mentioned above, it is an object of the present invention to provide a nitride semiconductor laser device that offers a longer life, to provide a simple method of fabrication thereof, and to provide a semiconductor optical device provided therewith. It is another object of the present invention to provide a nitride semiconductor light-emitting device that can be fabricated with reduced defects and at an increased yield rate.

The nitride semiconductor substrate described in the present specification is a substrate that contains at least $Al_xGa_yIn_zN$ (where $0 \leq x \leq 1$, $0 \leq y \leq 1$, $0 \leq z \leq 1$, and $x+y+z=1$). The nitride semiconductor substrate may have about 20% or less of the nitrogen that it contains as an ingredient thereof replaced with at least one element selected from the group consisting of As, P, and Sb. Moreover, 10% or less (provided that it has a hexagonal crystal) of the nitrogen contained in the substrate may be replaced with one element selected from the group consisting of As, P, and Sb. In the present specification, any such substrate is called a GaN substrate.

The most preferable material for the nitride semiconductor substrate is GaN, which has a binary crystal. Using a binary crystal helps to obtain a substrate with a constant composition and stable characteristics, and also helps to eliminate variation in composition during epitaxial growth. Using GaN helps to obtain good conductivity. Next in rank as a preferable material for the substrate comes AlGaN. Using a material, such as AlGaN, that has a lower refractive index than GaN makes possible satisfactory confinement of laser light in the active layer in cases where a semiconductor laser that emits light in an ultraviolet to blue region of the spectrum is built with a material as described above.

The nitride semiconductor substrate may have impurities added thereto, such as an n-type or p-type dopant. Examples of such impurities include, among others, Cl, O, S, Se, Te, C, Si, Ge, Zn, Cd, Mg, and Be. The preferable total amount of impurities added is from $5 \times 10^{16}$ cm$^{-3}$ to $5 \times 10^{20}$ cm$^{-3}$, both ends inclusive. Particularly preferable as an impurity added to the nitride semiconductor substrate to give it n-type conductivity is one of Si, Ge, O, Se, and Cl.

The nitride semiconductor layer laid on top of the nitride semiconductor substrate described in the present invention is a layer that contains at least $Al_xGa_yIn_zN$ (where $0 \leq x \leq 1$, $0 \leq y \leq 1$, $0 \leq z \leq 1$, and $x+y+z=1$). The nitride semiconductor layer thus laid may have about 20% or less of the nitrogen that it contains as an ingredient thereof replaced with at least one element selected from the group consisting of As, P, and Sb.

The nitride semiconductor layer may have impurities added thereto, such as an n-type or p-type dopant. Examples of such impurities include, among others, Cl, O, S, Se, Te, C, Si, Ge, Zn, Cd, Mg, and Be. The preferable total amount of impurities added is from $5\times10^{16}$ cm$^{-3}$ to $5\times10^{20}$ cm$^{-3}$, both ends inclusive. Particularly preferable as an impurity added to the nitride semiconductor layer to give it n-type conductivity is one of Si, Ge, S, Se, and Cl. Particularly preferable as an impurity added to the nitride semiconductor layer to give it p-type conductivity is one of Mg, Cd, and Be.

The active layer described in the present specification should be understood to denote any layer composed of a well layer alone or of one or more well layers combined with barrier layers. For example, an active layer having a single quantum well structure is composed of a single well layer alone or of a barrier layer, a well layer, and a barrier layer; an active layer having a multiple quantum well structure is composed of a plurality of well layers and a plurality of barrier layers.

In the present specification, a negative index in a formula indicating a plane or orientation of a crystal will be represented by a negative sign "–" followed by the absolute value of the index, instead of the absolute value accompanied by an overscore placed thereabove as required by convention in crystallography, simply because the latter notation cannot be adopted in the present specification. Likewise, such a plane orientation as has a polarity reverse to a particular plane orientation, such as the C, A, or M plane, will be represented by a negative sign "–" followed by the symbol of that particular plane orientation.

To achieve the above objects, according to the present invention, a plurality of nitride semiconductor layers are laid on top of a nitride semiconductor substrate. Here, the nitride semiconductor layers include: an active layer having a quantum well structure by being composed of one or more well layers and one or more barrier layers, and an acceptor doping layer. Moreover, the nitride semiconductor substrate includes, as a part thereof, a dislocation-concentrated region and, as all the remaining part thereof, a low-dislocation region. Furthermore, the nitride semiconductor layers laid immediately above the dislocation-concentrated region and the low-dislocation region have a depression immediately above the dislocation-concentrated region.

This depression separates adjacent portions of the low-dislocation regions, and thereby serves to effectively reduce the stresses and strains that are produced between layers of different mixed crystal compositions (for example, between an AlGaN layer used as a cladding layer and other layers) included in the device structure. Thus, the stresses that are produced between a plurality of nitride semiconductor layers having different lattice constants which are laid immediately above the low-dislocation region are effectively reduced. This helps to reduce cracks, to make higher-quality epitaxial growth possible, and to enhance the light-emission characteristics, electrical characteristics, and life characteristics of the device.

For this device with enhanced characteristics to be produced with a high yield rate, it is preferable that, on the top surface of the nitride semiconductor substrate, the area of the dislocation-concentrated region be smaller than the area of the low-dislocation region.

For easy formation of the depression immediately above the dislocation-concentrated region, the dislocation-concentrated region may be the c-plane, which has a reverse polarity.

Moreover, slightly slanting the topmost surface of the nitride semiconductor substrate, on top of which the device structure is laid, at an angle whose absolute value is in the range from 0.3° to 0.7° relative to the C plane offers the following benefits in addition to those already mentioned above. Defects remaining in the substrate are prevented from spreading to the nitride semiconductor layers, and the surface flatness of the device is improved, making higher-quality epitaxial growth possible. This helps to reduce dislocations penetrating the nitride semiconductor layers, to reduce current paths that do not contribute to light emission, and to enhance the surface flatness of the primer layer for the active layer. Thus, it is possible to realize a nitride semiconductor laser device that offers a long life.

Moreover, the great reduction of defects in the nitride semiconductor layers laid on top eliminates the need for an activation process such as heat treatment, because the activator doping layer as is grown readily exhibits p-type conductivity.

When the plurality of nitride semiconductor layers constituting the device structure are laid on top of the substrate having the dislocation-concentrated and low-dislocation regions, by making the total thickness of the layers laid immediately above the dislocation-concentrated region equal to or smaller than half their total thickness immediately above the low-dislocation region, it is possible to separate, with the depression, adjacent portions of the low-dislocation region including a high luminescence region so as to make them discontinuous. This helps to greatly reduce the stresses applied to and the resulting strains produced in the nitride semiconductor layers immediately above the adjacent portions of the low-dislocation region.

In this way, it is possible to free the active layer in the device structure from strains, and thereby to eliminate factors that degrade the device characteristics, such as phase separation or local agglomeration of In. Moreover, by separating adjacent portions of the low-dislocation region, it is possible to effectively reduce cracks that develop in the device when there are large strains, and thereby to increase the production yield. Densely concentrated dislocations spread from the substrate to the nitride semiconductor layers immediately above the dislocation-concentrated region, making it undesirable to form the device structure there. However, by reducing the total thickness of the nitride semiconductor layers immediately above the dislocation-concentrated region in advance in the stage in which they are grown, it is possible to automatically make it impossible to form the device structure there. This makes the screening of chips easy when individual chips are separated, and thus helps enhance the production yield.

As described above, by forming the depression in the nitride semiconductor layers immediately above the dislocation-concentrated region and thereby separating adjacent regions immediately above the low-dislocation region, it is possible to improve the device characteristics and the yield simultaneously. However, if the plane orientation of the substrate surface is the C plane, surface irregularities in the shape of hexagonal cones may develop on the surface of the grown nitride semiconductor layers. Development of these surface irregularities may degrade the steepness and planar uniformity of the active layer.

To avoid this, the substrate surface is slanted at an angle whose absolute value is in the range from 0.3° to 0.7° relative to the C plane. This helps to enhance flatness. The mechanism working here is believed to be as follows. At an early stage of the growth of the nitride semiconductor layers, a growth nucleus is formed starting at a kink of the terrace structure present on the substrate surface slanted at an angle whose absolute value is in the range from 0.3° to 0.7° relative to the C plane. Then, lateral growth is performed, starting at the growth nucleus, uniformly in the direction of the terrace. This helps to realize satisfactory two-dimensional growth, and eventually to make flat the surface after film formation.

Meanwhile, irrespective of whether growth proceeds two-dimensionally or not, dislocations present in the substrate spread into the layers being grown. Thus, to eliminate the effects of the dislocation-concentrated region and thereby to increase the yield in the cleaving process, it is effective, as described above, to reduce the total thickness of the layers grown immediately above the dislocation-concentrated region.

Moreover, by slanting the substrate surface at an angle whose absolute value is in the range from 0.30° to 0.70° relative to the C plane, it is possible to obtain an optimum, uniform terrace. This helps to achieve two-dimensional growth in which the materials in a gas phase reach the substrate surface and, while repeating migration and re-evaporation, uniformly form the growth nucleus, depositing one layer on top of another on the surface. This helps to produce a device that has reduced threading dislocations, that achieves efficient current injection, that produces reduced heat, and that has a surface with enhanced flatness. Moreover, it is possible to realize enhanced crystallinity and a uniform composition in the light-emitting layer containing In. In this way, it is possible to enhance the light-emitting characteristics of the device and to extend the life thereof.

As a result of the reduction of defects in the acceptor doping layer included in the nitride semiconductor multiple-layer film laid on top of the substrate, the acceptor impurities are no longer captured by such defects, and are therefore less likely to be deactivated by hydrogen. Thus, even without an activation process such as heat treatment, the acceptor doping layer as is grown readily exhibits p-type conductivity, with a hole density of $10^{17}$ cm$^{-3}$ or more. This makes it possible to reduce the heat history applied to the active layer, and thus to produce the device without degrading the active layer and without degrading the device characteristics. Here, there is no particular restriction on the direction in which the substrate surface is slanted relative to the C plane (the<0001> direction), though the<11-20> or <1-100> direction is preferred.

Slanting the substrate surface helps to suppress the spreading of defects into the device structure laid on top thereof, and thereby helps improve the flatness of the surfaces of the individual layers, permitting steep interfaces to be formed therebetween. This effect contributes to enhanced quality of, in particular, the active layer. Usually, in an active layer having a quantum well structure, the individual well layers and barrier layers are as thin as about several nm, and therefore the uniformity of the film thickness of the individual layers is greatly affected by the surface condition of the primer layer. If the surface flatness of the layer immediately under the active layer is, for example, several nm, which is about equal to the thickness of a well layer or barrier layer, place-to-place variations of the device composition, thickness, or the like of the quantum well structure disturb uniformity, resulting in nonuniform quantum level, which affects the light-emission characteristics. According to the present invention, the substrate surface is slanted at an angle whose absolute value is in the range from 0.3° to 0.7° relative to the C plane. This permits the individual layers constituting the device to be formed flat, and thereby makes it possible to solve the problems mentioned above.

To satisfactorily enhance the flatness of the well layers and barrier layers that constitute the active layer, it is advisable to make the total thickness of all the layers laid between the substrate and the active layer equal to or greater than 1 μm. This helps to make the above-described effect more noticeable. At least one of the element selected from the group consisting of As, P, and Sb may be added to the active layer.

Advisably, the substrate is made of a nitride semiconductor, and has, as a part thereof, a dislocation-concentrated region and, as all the remaining part thereof, a low-dislocation region. This helps to greatly reduce the density of dislocations present in the low-dislocation region than in a common substrate, and thus helps to make the above-described effect still more noticeable.

In a semiconductor optical device according to the present invention, a nitride semiconductor laser device as described above is used as a light source.

To achieve the above objects, according to the present invention, in a nitride semiconductor light-emitting device having a plurality of nitride semiconductor layers laid on top of a nitride semiconductor substrate, the nitride semiconductor substrate includes, as a part thereof, a stripe-shaped defect-concentrated region in which crystal defects concentrate and, as all the remaining part thereof, a low-defect region, and the top surface of the nitride semiconductor substrate has an off-angle in the direction perpendicular to the direction of the stripe of the defect-concentrated region.

As described above, in the present specification, in a nitride semiconductor substrate, the stripe-shaped region where defects concentrate as a result of the positions of defects controlled as desired is called the dislocation-concentrated region, and the region where the concentration of defects is low which is obtained as a result of concentrating the positions of defects in the dislocation-concentrated region is called the low-dislocation region.

By forming the nitride semiconductor layers on the top surface of the nitride semiconductor substrate which has an off-angle in the direction perpendicular to the stripe of the defect-concentrated region, it is possible to obtain, on the top surface of the nitride semiconductor substrate, a depression-like region where light emission is less uniform above one of the low-defect regions located on both sides of the dislocation-concentrated region. In the present specification, this region where light emission is less uniform is called the uniformly-light-emitting region. Incidentally, the direction in which a low-defect region is obtained with respect to a defect-concentrated region depends on the off-angle in the direction perpendicular to the stripe of the defect-concentrated region.

According to the present invention, in the nitride semiconductor light-emitting device described above, the off-angle is in the range from 0.2° to 2.0°, both ends inclusive.

When the top surface of a nitride semiconductor substrate having a defect-concentrated region has an off-angle in the range from 0.2° to 2.0°, both ends inclusive, with respect to the stripe-shaped defect-concentrated region, a uniformly-light-emitting region is obtained in the nitride semiconductor layers formed on top of the nitride semiconductor substrate. This uniformly-light-emitting region does not always have a constant width; the width and depth of the uniformly-light-emitting region vary with the off-angle. Specifically, the tendency is that, the gentler the off-angle, the greater the width and the smaller the depth; by contrast, the sharper the off-angle, the smaller the width and the greater the depth. Moreover, the uniformly-light-emitting region is formed within a range of 50 μm or more but 200 μm or less of the edge of the defect-concentrated region. However, an off-angle of 0.2° or less is undesirable because it makes the uniformly-light-emitting region unlikely to appear, and an off-angle of 2.0° or more is also undesirable because it gives the uniformly-light-emitting region too small a width.

According to the present invention, in the nitride semiconductor light-emitting device described above, the top surface of the nitride semiconductor substrate has an off-angle in the direction parallel to the direction of the stripe of the defect-concentrated region, and the off-angle is 2° or less.

The off-angle in the direction parallel to the stripe-shaped defect-concentrated region may be just zero (0°), but is preferably 2° or less. The reason is that, when the top surface of the GaN substrate has an off-angle in the direction parallel to the stripe of the defect-concentrated region, it is possible to make substantially constant the width of the uniformly-light-emitting region in the surface of the nitride semiconductor layers formed on top of the nitride semiconductor substrate. However, it is desirable that the off-angle in the direction parallel to the stripe of the defect-concentrated region be smaller than the off-angle in the direction perpendicular thereto. The reason is that there is a tendency that, when the off-angle in the perpendicular direction is sharp, the uniformly-light-emitting region is narrow, and that, when the off-angle in the parallel direction is greater than that in the perpendicular direction, the uniformly-light-emitting region is obtained in a narrower region.

According to the present invention, a ridge-stripe portion or a narrowed-current portion is formed on the uniformly-light-emitting region. This helps reduce variations in the device characteristics, such as the wavelength, of individual chips separated, and thus helps increase the yield. However, in a region within about 30 μm of the defect-concentrated region, the top surface of the nitride semiconductor layers is elevated and its width is not constant. This makes it difficult to form a ridge-stripe portion or a narrowed-current portion there. Accordingly, this region needs to be avoided.

As described above, by growing a nitride semiconductor laser device structure on top of a GaN substrate having a stripe-shaped defect-concentrated region and having a predetermined off-angle, it is possible to obtain a uniformly-light-emitting region. By forming a ridge-stripe portion or a narrowed-current portion on this region, it is possible to realize, with a high yield, a nitride semiconductor light-emitting device with less defects, with an improved useful life, and with high reliability.

BRIEF DESCRIPTION OF THE DRAWINGS

This and other objects and features of the present invention will become clear from the following description, taken in conjunction with the preferred embodiments with reference to the accompanying drawings in which.

DETAILED DESCRIPTION OF PREFERRED EMBODIMENTS

Hereinafter, embodiments of the present invention will be described with reference to the drawings.

Embodiment 1

Figure 1:
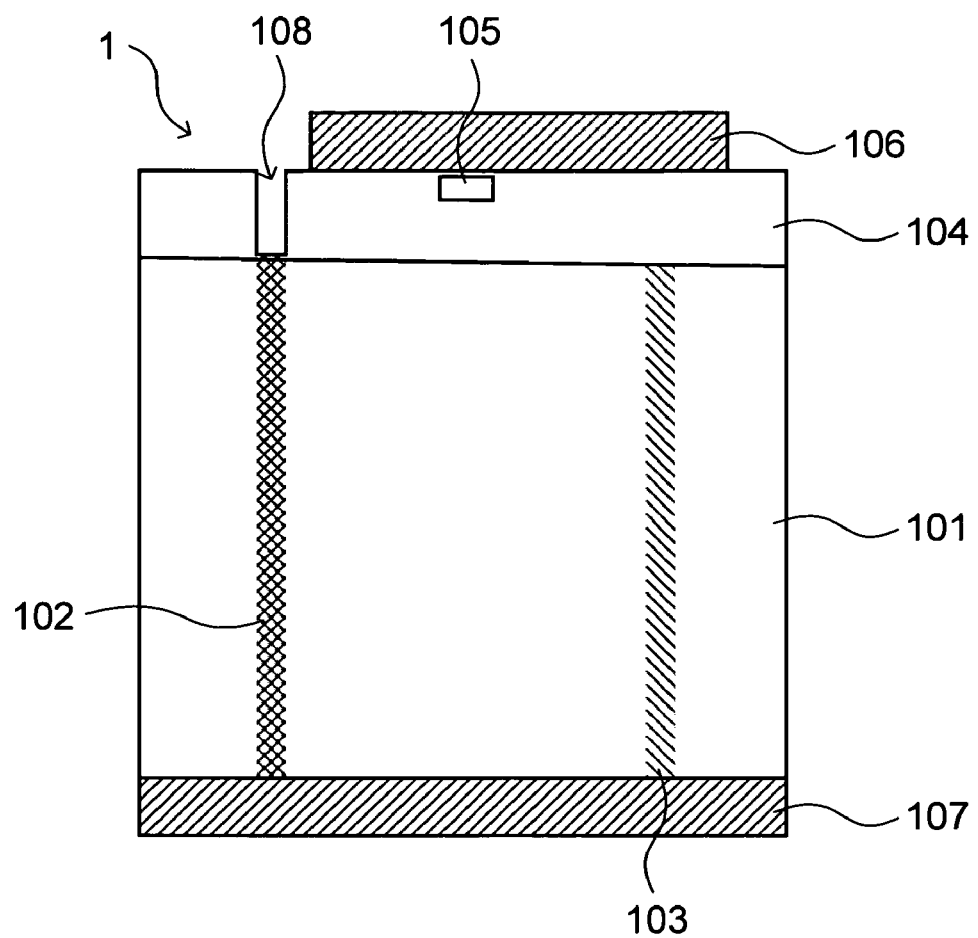
FIG. 1 a sectional view schematically showing the semiconductor laser device of Embodiment 1 of the invention.

FIG. 1 is a sectional view schematically showing the semiconductor laser device 1 of Embodiment 1 of the invention. This figure shows the semiconductor laser device 1 of this embodiment as seen from the direction in which it emits light. In FIG. 1, reference numeral 101 represents an n-type GaN substrate of which the topmost surface is inclined slightly, specifically in the range from 0.3° to 0.7° in absolute-value terms, relative to the C-plane. The substrate 101 includes, as a part thereof, a dislocation-concentrated region 102, all the remaining part of the substrate 101 being a low-dislocation region. The low-dislocation region in turn includes, as a part thereof, a high-luminescence region 103, which runs parallel to the dislocation-concentrated region 102. On top of the substrate 101, a nitride semiconductor layer (epitaxially grown layer) 104 is formed. The nitride semiconductor layer 104 has a laser light waveguide region 105 formed inside it, and has a depression 108 formed immediately above the dislocation-concentrated region 102. On the top surface of the nitride semiconductor layer 104 and on the bottom surface of the substrate 101, there are formed electrodes 106 and 107, respectively.

Now, a description will be given of the fabrication procedure of the semiconductor laser device of this embodiment, with more detailed explanations of the structure thereof given whenever appropriate.

Fabrication Procedure of the GaN Substrate

First, an outline of how the crystal of the n-type GaN substrate 101 is grown will be described. A GaN crystal is grown with facets kept exposed as inclined surfaces so that the inclined surfaces are maintained. That is, as crystal growth proceeds, the inclined surfaces are gradually moved in the direction of the growth. This permits dislocations that appear in the middle portions of the inclined surfaces to spread to and aggregate at the lower ends of the inclined surfaces, forming dislocation-concentrated regions where the lower ends of the inclined surfaces were located and low-dislocation regions where the middle portions of the inclined surfaces were located.

The dislocation-concentrated regions can be in one of different states: they may be polycrystalline; or they may be monocrystalline, slightly inclined relative to the surrounding low-dislocation regions; or they may have the opposite growth direction [000-1] to the growth direction [0001] of the surrounding low-dislocation regions. This produces clear boundaries between the dislocation-concentrated regions and the low-dislocation regions.

Since the inclined surfaces are moved in the growth direction, by appropriately producing the facets that appear at the beginning, it is possible to determine the shape of the dislocation-concentrated regions. If facets like the side faces of an inverted pyramid (with its vertex down and base up) are produced at the beginning, dislocations concentrate at the vertices of such pyramids, and thus the dislocation-concentrated regions are formed in straight lines parallel to the growth direction, forming pits. If facets like the side faces of a groove with a V-shaped section are produced at the beginning, dislocations concentrate at the bottoms of such grooves (the linear parts thereof), and thus the dislocation-concentrated regions are formed in a plane parallel to the growth direction, forming stripes.

As a seed of the facets that are produced at the beginning, a mask that impedes crystal growth can be used. Crystal growth starts where no mask is present, and thus facets are produced at the boundaries between where no mask is present and where the mask is present. As crystal growth proceeds in the horizontal direction, the facets meet on the mask, and at those meeting points the dislocation-concentrated regions start to form.

After the facets meet, crystal growth proceeds stably in the vertical direction (the very direction in which crystal growth is inherently supposed to proceed), and thus the facets move, as they are, in the growth direction, permitting the dislocation-concentrated regions to extend in the growth direction. If the mask that impedes crystal growth is given a pattern of dots, facets like the side faces of an inverted pyramid are produced; if the mask is given a pattern of straight lines, facets like the side faces of a groove with a V-shaped section are produced. The mask may be an amorphous or polycrystalline layer, and is formed, for example, by laying a thin film of $SiO_2$ on the surface of a base member.

After crystal growth, the surface is specularly polished so that the topmost surface is inclined slightly, specifically in the range of 0.3° to 0.7° in absolute-value terms, relative to the C plane. In this way, it is possible to obtain a substrate on which a high-quality nitride semiconductor layer can be laid.

This embodiment deals with a substrate that has dislocation-concentrated regions arranged in a pattern of stripes or of dots. That is, either facets are produced in a V shape so that dislocation-concentrated regions are formed in a pattern of stripes, or a large number of facets so shaped as to surround dots are produced at short intervals so that dislocation-concentrated regions are formed, when observed macroscopically, in a pattern of stripes. Alternatively, a large number of facets so shaped as to surround dots are produced at long intervals in a nested fashion so that dislocation-concentrated regions are formed in a pattern of discrete dots.

Next, a practical example of the fabrication procedure of the n-type substrate 101 will be described with reference to FIG. 2. On a support base member 201, an n-type GaN layer 202 is grown by HVPE in such a way that chiefly the {11-22} facet 203 is exposed at the surface during growth. This causes the surface to have a sawtooth-shaped section with ridges and troughs. Near the tops of the ridges, however, was slightly exposed the {0001} plane 206 in the shape of stripes. This is illustrated in the (partial) sectional view in FIG. 2(a).

Here, HVPE is a process that involves the following operations. In a boat provided in an upstream part of a hot-wall reactor furnace, HCL gas is blown into heated molten Ga to produce GaCl, which is then sent downward. In a downstream part of the reactor furnace, $NH_3$ is blown into a support base member placed there. Thus, in the downstream part, the two react, depositing GaN on the base member.

Used as the support base member 201 was a two-inch (111) GaAs wafer. There is no particular restriction on the material of the base member 201, and it is possible to use sapphire as commonly used. However, for easy separation of the base member from the GaN deposited thereon, it is preferable to use GaAs or the like to minimize waste.

The ridges and troughs mentioned above have a periodic structure with a pitch P of 400 μm, and have a shape that extends, like ridges in a crop field, in the depth direction of the figure. To determine where to locate these ridges and troughs, a mask of $SiO_2$ or the like may be formed beforehand on the base member 201 where the troughs are supposed to run so that crystal growth proceeds while the mask is used as a seed of the facets that are exposed. That is, the mask has a pattern of stripes arranged parallel to the [1-100] direction of the GaN crystal with a pitch P of 400 μm. Thus, the mask has the shape of continuous stripes, or of a large number of dots located at substantially regular intervals on straight lines.

The technique of (and the conditions for) maintaining crystal growth with the {11-22} facet kept exposed is disclosed in detail in Japanese Patent Application Laid-Open No. H11-273882, which the applicant of the present invention once filed. The grown crystal was made n-type by being doped with O while growing.

Figure 2A:
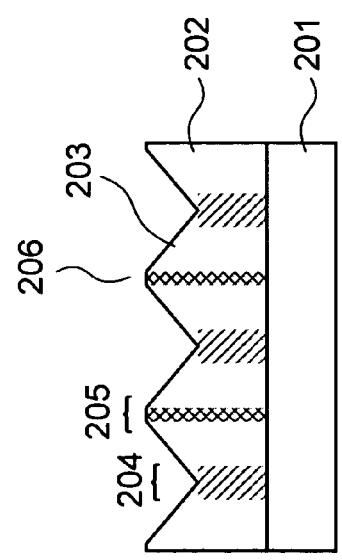
FIG. 2(a) is a sectional view of the nitride semiconductor substrate in the fabrication procedure, FIG. 2(b) a perspective view schematically showing the ingot, FIG. 2(c) a sectional view of the nitride semiconductor substrate, FIG. 2(d) a top view of the nitride semiconductor substrate, and FIG. 2(e) a top view of the nitride semiconductor substrate.
Figure 2B:
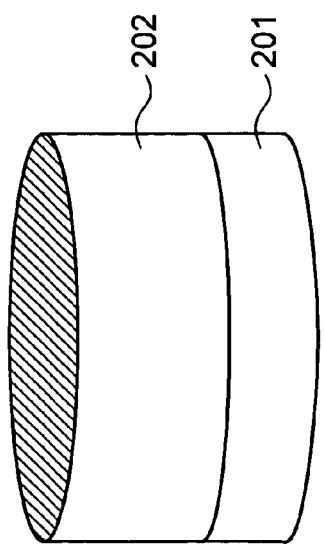

By continuing the growth of the GaN crystal with this growth mode maintained, a 30 mm high ingot was produced on top of the base member 201. FIG. 2(b) schematically shows the ingot.

Using a slicer, this ingot was sliced into thin pieces (each an n-type GaN substrate). The thin piece was then polished to produce a flat-surfaced n-type GaN substrate 101 measuring two inches (about 5 cm) in diameter and 350 μm in thickness. The surface for epitaxial growth was specularly polished. At the surface appeared largely the (0001) plane, but here it was preferable that the surface be inclined at a comparatively small angle, specifically in the range of 0.2° to 1° in absolute-value terms, in any direction relative to the (0001) plane. This helps effectively prevent the spreading of defects from the substrate to the nitride semiconductor layer 104 epitaxially grown thereon and thereby achieve epitaxial growth with satisfactory surface morphology. In particular, for maximum surface flatness, it was preferable that the inclination angle be in the range of 0.3° to 0.7° in absolute-value terms.

Figure 2C:
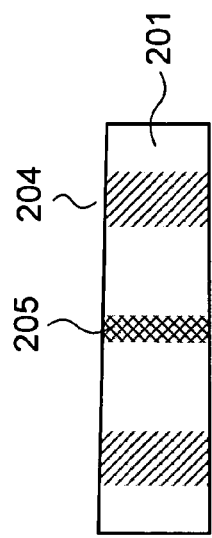
Figure 2D:
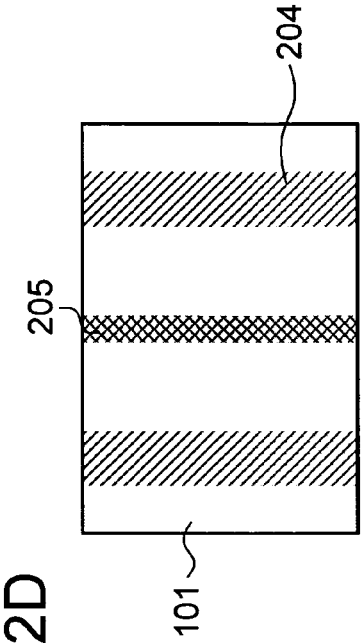
Figure 2E:
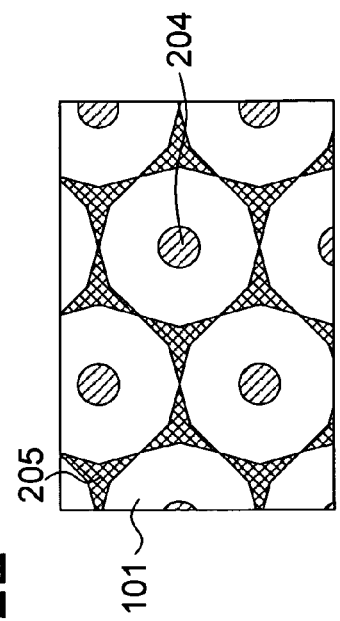

FIG. 2(c) is a sectional view (showing a part) of the n-type substrate 101 obtained in this way, and FIGS. 2(d) and 2(e) are top views (showing a part) thereof. FIG. 2(d) schematically shows the surface of a substrate on which dislocation-concentrated regions 204 and high-luminescence regions 205 are arranged in a pattern of stripes. FIG. 2(e) schematically shows the surface of a substrate on which dislocation-concentrated regions 204 are formed in a pattern of dots or circles, low-dislocation regions are formed in a pattern of dodecagons, and high-luminescence regions 205 are arranged in the gaps across which the low-dislocation regions adjoin. Within the substrate surface, the dislocation-concentrated regions 204, low-dislocation regions, and high-luminescence regions 205 may be arranged in any other manner than in the examples shown in FIGS. 2(d) and 2(e). For example, the dislocation-concentrated regions may be arranged in a pattern of broken lines. By appropriately selecting the mask pattern used at an early stage of growth, it is possible to adjust the individual regions on the substrate.

The GaN substrate 101 thus obtained was evaluated in the following manner. First, the surface of the GaN substrate 101 was closely inspected under a microscope. Even though polished, the surface was not perfectly flat, but had small depressions in regions corresponding to those where the bottommost parts of the troughs were located during crystal growth (the regions indicated by reference numeral 204 in FIG. 2(a)).

Then, the sample was etched by being dipped in a mixture of sulfuric acid and phosphoric acid heated to 250° C. so that etch pits appeared at the surface. As a result, in regions corresponding to those where the bottommost parts of the troughs were located during crystal growth (the regions indicated by reference mark 204 in FIG. 2(a)), many etch pits appeared, attesting that those regions were where dislocations (or crystal defects) were highly concentrated (i.e., dislocation-concentrated regions). That is, the depressions mentioned above corresponded to these regions.

As described above, the regions in which depressions were observed had highly concentrated dislocations, and thus were more easily eroded than other regions. This probably is the reason that the depressions were formed there. The dislocation-concentrated regions were about 10 to 40 μm wide. All the other regions were low-dislocation regions with EPDs (etch pit densities) of the order of $10^4$ to $10^5$ cm$^{-2}$. The dislocation-concentrated regions were observed to have three or more orders of magnitude greater EPDs. Thus, the regions indicated by reference numeral 102 are where the dislocation density is several orders of magnitude higher than elsewhere, and this is the reason that those regions are called "dislocation-concentrated regions" in the present specification.

Moreover, with the sample irradiated with ultraviolet rays (the 365 nm spectral line of a Hg lamp can be used), the luminescence from the surface was observed under a microscope (fluorescence microscopy). As a result, in the middle portions of the low-dislocation regions sandwiched between the dislocation-concentrated regions 102, stripe-shaped regions were observed that had comparatively clear boundaries and that had different contrast from the adjoining regions. These regions exhibit more intense luminescence, which can be observed with the naked eye, than the adjoining regions, and are observed to be yellowish and bright.

These regions are the parts 203 which grew with the {0001} facet exposed during crystal growth, and are thus the regions indicated by reference numerals 103 and 205 in FIGS. 1 and 2(d), respectively. One of the probable reasons that these regions are observed to appear different from the adjoining regions is that the dopant is absorbed differently there than in the adjoining regions. On the basis of the facts described above, in the present specification, these regions are called "high-luminescence regions." During crystal growth, the parts 203 that grow with the {0001} facet exposed do not always advance uniformly with a constant width. Thus, the high-luminescence regions 205 had slightly fluctuating widths, about 30 μm at the maximum.

Hardly any high-luminescence regions may be formed depending on the conditions under which the above-mentioned ingot is produced and on the position within the ingot (i.e., the distance from the support base member). However, the substantially middle regions of the parts sandwiched between the dislocation-concentrated regions 204 correspond to the regions near the tops of the above-mentioned ridges and troughs, and, in the present specification, these regions are also called "low-dislocation region middle regions." In the present specification, any description mentioning the high-luminescence regions should be understood to mention the low-dislocation region middle regions.

The formation of the GaN substrate 101 may be achieved by any vapor-phase crystal growth process other than HVPE; it may be formed, for example, by MOCVD (matalorganic chemical vapor deposition), MOC (matalorganic chloride vapor phase epitaxy), or sublimation.

Used as the base member 301 on which to grow the GaN substrate 101 may be, instead of GaAs, a crystal substrate that has sixfold or threefold symmetry about an axis. That is, a hexagonal or cubic crystal can be used. With a cubic crystal, using the (111) plane results in threefold symmetry. Examples of hexagonal crystals that can be used include SiC, $SiO_2$, $NdGaO_3$, ZnO, GaN, and AlN. Sapphire, of which the structure is, strictly speaking, rhombohedral but very close to hexagonal, can also be used. Examples of cubic crystals of which a (111) plane substrate can be used include Si, spinel, MgO, and GaP. With these, GaN is grown on the C plane.

The mask that is used in the formation of the GaN substrate 101 is laid by one of the following two methods. By one method, the mask is formed directly on the base member. In this case, it is advisable to take a preparatory step prior to epitaxial growth as by depositing a GaN buffer layer on the surface where the base member will be exposed through the openings in the mask. By the other method, a comparatively thin GaN layer is formed beforehand on the base member, and then the mask is formed on top. In many cases, the latter method proves to be preferable, permitting smooth progress of growth.

The embodiment being described deals with a case where GaN is used as the substrate 101, but the material thereof may be replaced with any mentioned earlier in the "SUMMARY OF THE INVENTION" section.

In the procedure for fabricating a nitride semiconductor substrate described earlier in the "Description of the Prior Art" section, as the growth of the substrate crystal proceeds, a lateral growth technique (ELOG) is used to reduce dislocations. However, there, the positions of dislocations (defects) are not controlled, with the result that, as crystal growth proceeds, dislocations come to be distributed uniformly in a plane. By contrast, in the nitride semiconductor substrate used in the present invention, throughout the growth of the substrate crystal, the positions of dislocation-concentrated regions are controlled so that they are located at predetermined positions (with a pitch of the order of several hundred μm). This is the difference between the prior-art GaN substrate and the nitride semiconductor substrate used in the present invention.

Accordingly, to produce a substrate with a given dislocation density, the procedure for fabricating the substrate crystal described in connection with the currently described embodiment requires less crystal growth steps, leading to higher productivity.

Epitaxial Growth of the Nitride Semiconductor Layer

Figure 3:
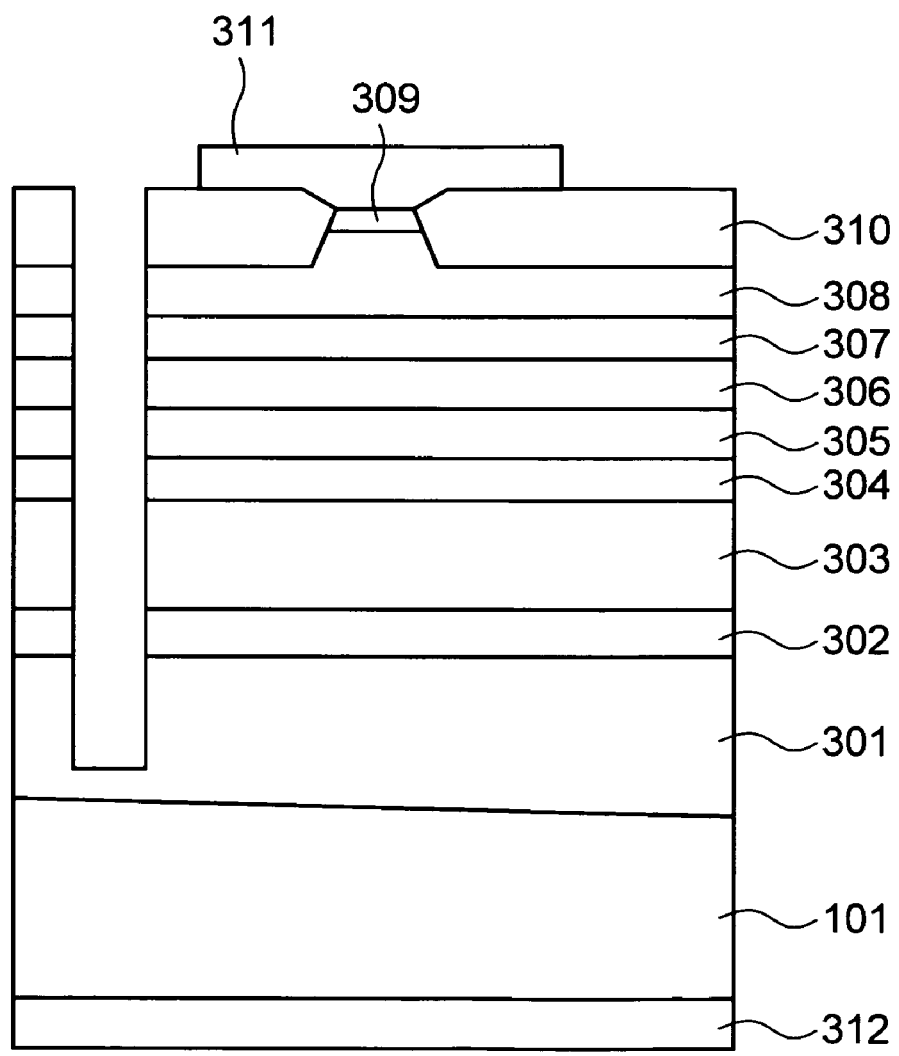
FIG. 3 is a sectional view schematically showing the layer structure of the semiconductor laser device of Embodiment 1.

Next, how the nitride semiconductor layer 104 etc. are formed on top of the n-type GaN substrate 101 to fabricate the semiconductor laser device 1 will be described with reference to FIGS. 3 and 4. FIG. 3 is a diagram schematically showing the semiconductor laser device 1 of FIG. 1, with the layer structure of the nitride semiconductor layer 104 illustrated in detail. In this figure, the already-described structure within the substrate 101 is omitted. FIG. 4 is a diagram schematically showing how growth proceeds when a nitride semiconductor layer is grown on the C-plane substrate of GaN and on a GaN substrate of which the surface is inclined at an angle in the range of 0.3° to 0.7° in absolute-value terms relative to the C plane.

Using a MOCVD machine, $SiH_4$ as a dopant material was added to $NH_3$ as a group V material and TMGa (trimethyl gallium) or TEGa (triethyl gallium) as a group III material, and, at a substrate temperature of 1,050° C., a 3 μm thick n-type GaN layer 301 was formed on the n-type GaN substrate 101. As described in the "Fabrication Procedure of the GaN Substrate" section above, the substrate 101 may have dislocation-concentrated regions arranged in a pattern of stripes, or may have them arranged in a pattern of dots in a nested fashion. In a case where the dislocation-concentrated regions has a pattern of dots, they do not necessarily have to be arranged in a nested fashion. More specifically, so long as the substrate 101 has dislocation-concentrated regions in a state clearly distinguishable from low-dislocation regions and in addition, when seen from the direction perpendicular to the surface on which to grow a nitride semiconductor layer, the dislocation-concentrated regions have a smaller area than the low-dislocation regions, it can be used satisfactorily irrespective of the arrangement of the individual dislocation-concentrated regions.

After the formation of the n-type GaN layer 301, TMIn (trimethyl indium) as a group III material was added to the above-mentioned materials, and, at a substrate temperature of 800° C., a 40 nm thick n-type $In_{0.07}Ga_{0.93}N$ crack prevention layer 302 was grown. Next, the substrate temperature was raised to 1,050° C., and, using also TMAl (trimethyl aluminum) or TEAl (triethyl aluminum) as a group III material, a 1.2 μm thick n-type $Al_{0.1}Ga_{0.9}N$ cladding layer 303 was grown. As an n-type impurity, $5 \times 10^{17}$ to $1 \times 10^{19}$ of Si was added. Subsequently, a 0.1 μm thick n-type GaN light guiding layer 304 (with a Si impurity concentration of $10^{16}$ to $10^{18}$ $cm^{-3}$) was grown. It has been known that the total thickness of the layers thus far grown needs to be 1 μm or more to give the layer (in this embodiment, the n-type GaN light guiding layer) immediately below the active layer sufficient flatness to enhance the uniformity and quality of the active layer.

Thereafter, the substrate temperature is lowered to 750° C., and an active layer (multiple quantum well structure) 305 composed of 4 nm thick $In_{0.1}Ga_{0.9}N$ well layers and 8 nm thick $In_{0.01}Ga_{0.99}N$ barrier layers that are laid alternately on one another in three periods in the following order: a barrier layer, a well layer, a barrier layer, a well layer, a barrier layer, a well layer, and then a barrier layer. Meanwhile, $SiH_4$ (with a Si impurity concentration of $10^{16}$ to $10^{18}$ $cm^{-3}$) was added to the barrier layers or to both the barrier and well layers. It is preferable to suspend the growth for a period of one second or more but less than 180 seconds between adjacent barrier and well layers or between adjacent well and barrier layers, because this helps enhance the flatness of the individual layers and helps reduce the FWHM (full width at half maximum) of emitted light.

A preferred material used to add As to the active layer is $AsH_3$ (arsine) or TBAs (tertiary butyl arisine); a preferred material used to add P to the active layer is $PH_3$ (phosphine) or TBP (tertiary butyl phosphine); a preferred material used to add Sb to the active layer is TMSb (trimethyl antimony) or TESb (triethyl antimony). Used as the N material in the formation of the active layer may be, instead of $NH_3$, $N_2H_4$ (hydrazine), $C_2N_2H_8$ (dimethyl hydrazine), or an organic material containing N.

Next, the substrate temperature was raised back to 1,050° C., and a 20 nm thick p-type $Al_{0.3}Ga_{0.7}N$ carrier blocking layer 306, a 0.1 μm thick p-type GaN light guiding layer 307, a 0.5 μm p-type $Al_{0.1}Ga_{0.9}N$ cladding layer 308, and a 0.1 μm thick p-type GaN contacting layer 309 were grown in this order. As a p-type impurity, $EtCp_2Mg$ (bisethylcyclopentadienyl magnesium) was used as a material, and was added so that the Mg concentration was $10^{18}$ to $2 \times 10^{20}$ $cm^{-3}$. It is preferable that the p-type impurity concentration in a p-type GaN contacting layer 310 increase toward a p-electrode 311. This helps reduce the contact resistance due to the formation of the p-electrode. Moreover, to eliminate the residual hydrogen in the p-type layers which impedes the activation of Mg used as the p-type impurity, a trace amount of oxygen may be mixed during the growth of the p-type layers.

After the p-type GaN contacting layer 309 was grown in this way, all the contents inside the reactor of the MOCVD machine were replaced with nitrogen carrier gas and $NH_3$, and the temperature was lowered at a rate of 60° C. per minute. When the substrate temperature became 800° C., the supply of $NH_3$ was stopped, and then, after this substrate temperature was maintained for five minutes, it was lowered further to room temperature. Here, a preferred range of temperature at which the substrate is maintained is from 650° C. to 900° C., and a preferred range of duration for which that temperature is maintained is from three to ten minutes. A preferred rate at which the temperature is lowered is 30° C. or more per minute.

Figure 4C:
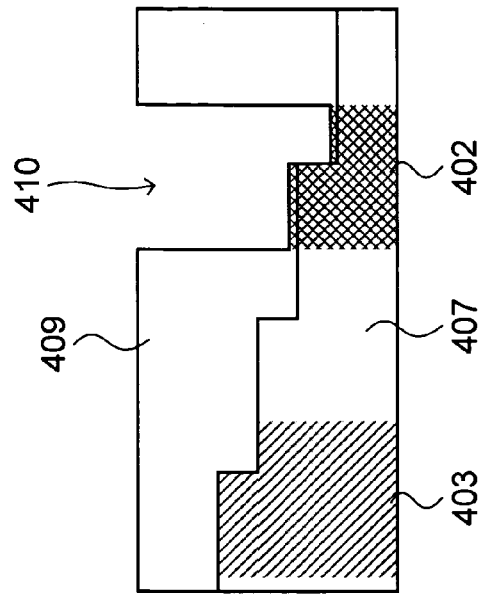
FIG. 4(c) is a sectional view schematically showing a grown nitride semiconductor layer on a substrate with a surface inclination, on completion of the growth.
Figure 4A:
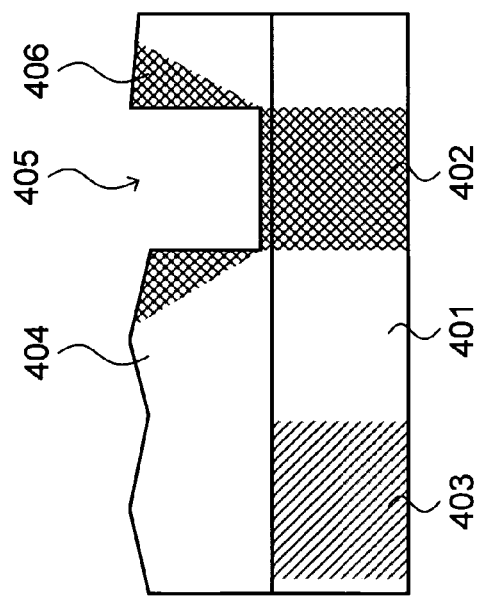
FIG. 4(a) is a sectional view schematically showing how a nitride semiconductor layer grows on a substrate with no surface inclination.

Now, how a nitride semiconductor layer grows on a C-plane substrate and on a substrate of which the surface is inclined at an angle in the range of 0.3° to 0.7° in absolute-value terms relative to the C plane will be described with reference to FIG. 4. For the sake of explanation, FIG. 4 includes some exaggeration. As shown in FIG. 4(a), when a nitride semiconductor layer 404 is grown on a C-plane substrate 401 that has no surface inclination and that includes dislocation-concentrated regions 402 and high-luminescence regions 403 inside it, elevations and depressions may develop on the surface of the grown layer 404. This indicates that two-dimensional growth is insufficient elsewhere than in the dislocation-concentrated regions 402. The elevations and depressions are, for example, projections in the shape of hexagonal prisms, and produce a rough surface.

Moreover, crystal growth is slower immediately above the dislocation-concentrated regions 402, because there the surface is terminated with nitrogen atoms. Thus, in these areas, the grown layer has a smaller total thickness, causing crystal growth to proceed in such a way as to produce depressions 405 right above the dislocation-concentrated regions 402. When two-dimensional growth is insufficient, as the thickness of the grown layer 404 increases, the dislocation-concentrated regions 402 present inside the substrate enlarge and spread into the grown layer to produce oblique dislocation-concentrated regions 406. The precise mechanism working here is unknown, but a probable explanation is that insufficient two-dimensional growth causes dislocations, which are inherently supposed to spread vertically, to spread in oblique directions, resulting in enlargement of dislocation-concentrated regions.

Figure 4B:
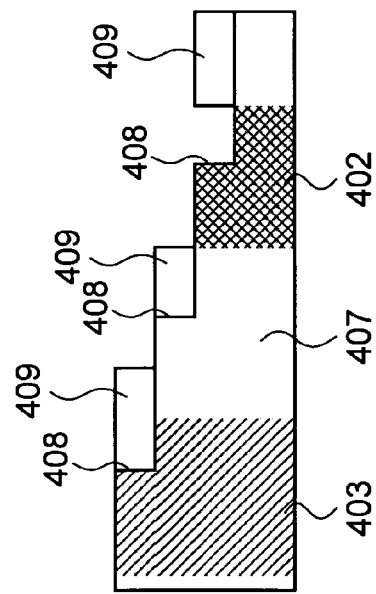
FIG. 4(b) is a sectional view schematically showing a grown nitride semiconductor layer on a substrate with a surface inclination, at an early stage of the growth.

By contrast, as shown in FIG. 4(b), in a substrate 407 that includes dislocation-concentrated regions 402 and high-luminescence regions 403 inside it and that has a surface inclination, its surface, when observed microscopically, has terrace-shaped kinks 408 arranged at regular intervals. When this substrate 407 is placed on a MOCVD machine and a nitride semiconductor layer is grown thereon, at an early stage of growth, kinks 404 that are present regularly on the surface of the substrate serve as the main starting points of crystal growth. Thus, for example, the group III material such as Ga, by repeating migration and absorption, starts to grow laterally from the kinks. This mode of growth is called two-dimensional growth.

When the lateral growth proceeds until it reaches the next kinks, the entire substrate surface is covered with a grown nitride semiconductor layer 409, and now a new layer starts to grow two-dimensionally. This is repeated so that, as time passes, growth proceeds in the thickness direction as shown in FIG. 4(c). In this way, two-dimensional growth proceeds regularly with kinks 408 due to a slight inclination of the substrate surface serving as starting points, and thus, when the grown nitride semiconductor layer 409 has grown to a certain thickness, its surface has sufficient flatness to produce with high quality a multiple quantum well active layer that is composed of many well and barrier layers, each several nm thick, on one another. Since, in the dislocation-concentrated regions 402, the surface is terminated with nitrogen atoms, growth is slower there, and accordingly, immediately above the dislocation-concentrated regions 402, depressions 410 remain even as growth proceeds.

Giving the substrate surface an inclination in the range of 0.3° to 0.7° relative to the C plane permits the dislocation-concentrated regions 402 present inside the substrate to spread vertically to the grown nitride semiconductor layer 409, and thus prevents dislocations from spreading into the grown nitride semiconductor layer 409. As a result of the foregoing, Giving the substrate surface an inclination in the range of 0.3° to 0.7° relative to the C plane helps enhance the flatness of the surface of the grown nitride semiconductor layer 409, and permits epitaxial growth of the nitride semiconductor layer without enlarging the dislocation-concentrated regions 402 inside the substrate.

The grown film thus produced was evaluated by Raman measurement, with the following results. After the wafer was taken out of the MOCVD machine, even without p-typifying annealing, the grown film exhibited p-type properties (the activation of Mg) immediately after growth. In addition, the contact resistance due to the formation of the p-electrode was low. Combining the above technique with conventional p-typifying annealing proved to be preferable, because it led to enhanced Mg activation.

Moreover, because of the depressions 410 resulting from the slower growth immediately above the dislocation-concentrated regions 402 where the substrate surface was terminated with nitrogen atoms, the grown nitride semiconductor layer 409 was divided at the pitch between adjacent dislocation-concentrated regions. This helped reduce the residual stress in the device, and thus helped achieve a lower crack density than in the conventional device structure, leading to an increased yield. This permits the $In_{0.07}Ga_{0.93}N$ crack prevention layer 302 to have an In content other than 0.07, and permits omission of the entire InGaN crack prevention layer.

The active layer 305 starts with a barrier layer and ends with a barrier layer; instead, it may start with a well layer and end with a well layer. The number of well layers formed may be any other than three as specifically described above; so long as the number is ten or less, a low threshold current density permitted continuous wave operation at room temperature. Two or more but six or less layers were particularly preferable, because of a low threshold current density. The active layer described above may further contain Al.

Here, a necessary amount of Si was added to both the well and barrier layers that constituted the active layer 305. This impurity does not necessarily have to be added, but adding an impurity such as Si to the active layer resulted in more intense light emission. The impurity may be, other than Si, O, C, Ge, Zn, or Mg used singly, or two or more of them used in combination. A preferred total amount of impurities added was about $10^{17}$ to $8\times10^{18}$ cm$^{-3}$. The impurity may be added to, instead of both the well and barrier layers, the well layers alone or the barrier layers alone.

The p-type $Al_{0.3}Ga_{0.7}N$ carrier blocking layer 306 may have a composition other than this specific composition. Using AlGaN having In added thereto is preferable, because it becomes p-type even when grown at a lower temperature, and thus helps alleviate the damage inflicted on the active layer 305 during crystal growth. The entire carrier blocking layer 306 may be omitted, but providing it resulted in a lower threshold current density. This is because the carrier blocking layer 306 serves to confine carriers inside the active layer 305. Increasing the Al content in the carrier blocking layer 306 is preferable, because it permits carriers to be confined more powerfully. By contrast, reducing the Al content down to a level that barely maintains confinement of carriers is also preferable, because it increases the carrier mobility inside the carrier blocking layer and thereby reduces the electrical resistance.

Here, an $Al_{0.1}Ga_{0.9}N$ crystal was used as each of the p-type cladding layer 308 and the n-type cladding layer 303. Instead, an AlGaN ternary crystal with an Al content other than 0.1 may be used. As the Al content in the mixed crystal increases, the differences in energy gap and in refractive index from the active layer 305 increase. This permits more efficient confinement of carriers and light in the active layer, leading to a lower threshold current density. By contrast, reducing the Al content down to a level that barely maintains the confinement of carriers and light, it is possible to increase the mobility of carriers in the cladding layer and thereby lower the operating voltage of the device. From this perspective, it is preferable that the Al content in the p-type cladding layer 308 be limited within the range from about 0.06 to 0.09.

A preferred range of the thickness of the n-type AlGaN cladding layer 303 is from 0.7 μm to 1.5 μm. This helps achieve a unimodal vertical lateral mode, increased light confinement efficiency, enhanced optical characteristics, and a lower threshold current density.

In the above description, an AlGaN ternary crystal was used as each of the cladding layers 303 and 308. Instead, a quaternary crystal such as AlInGaN, AlGaNP, or AlGaNAs may be used. For a reduced electrical resistance, the p-type cladding layer 308 may be given a superlattice structure composed of a p-type AlGaN layer and a p-type GaN layer, or a superlattice structure compose of a p-type AlGaN layer and a p-type AlGaN layer, or a superlattice structure composed of a p-type AlGaN layer and a p-type InGaN layer.

The description above deals with a case where the crystal was grown by using a MOCVD machine. It is, however, also possible to use molecular beam epitaxy (MBE) or hydride vapor phase epitaxy (HVPE).

Next, a description will be given of the process of taking out the epitaxial wafer having the individual layers of the n-type nitride semiconductor layer 104 formed on top of the n-type GaN substrate 101 out of the MOCVD machine and then forming it into individual nitride semiconductor laser device chips.

Producing Individual Devices

As the laser light waveguide region 105, a ridge-stripe portion is formed in the n-type GaN substrate 101, in the desired position described earlier with reference to FIG. 1. This is achieved by performing etching from the obverse side of the epitaxial wafer to the middle or lower end of the p-type cladding layer 308 so as to leave a stripe-shaped portion. Here, the stripe was 1 to 3 µm wide, and preferably 1.3 to 2 µm wide; the distance from the p-type guiding layer 307 to the etching bottom surface was 0 to 0.1 µm. Thereafter, an insulating film 310 was formed elsewhere than where the ridge-stripe portion was located. Here, the insulating film 310 was formed of AlGaN. The p-type GaN contacting layer 308 left unetched was exposed, and therefore, on this portion and on the insulating film 310, a p-electrode 311 was formed by vapor-depositing Pd/Mo/Au in this order.

The insulating film 310 may be formed, instead of the material mentioned above, an oxide or nitride of silicon, titanium, zirconia, tantalum, aluminum, or the like. The combination of materials for the p-electrode 311 may be, instead of the one mentioned above, Pd/Pt/Au, Pd/Au, or Ni/Au.

Then, the reverse side (substrate side) of the epitaxial wafer was polished to adjust its thickness to 80 to 200 µm so that the wafer would later be easier to separate. On the reverse side of the substrate, an n-electrode 312 was formed in the order Hf/Al. The combination of the materials for the n-electrode 312 may instead be Hf/Al/Mo/Au, Hf/Al/Pt/Au, Hf/Al/W/Au, Hf/Au, Hf/Mo/Au, or a modified version of any of these where Hf is replaced with Ti or Zr.

Lastly, the epitaxial wafer was cleaved in the direction perpendicular to the ridge stripe direction to produce a Fabry-Perrot cavity with a cavity length of 600 µm. A preferred range of the cavity length is from 250 µm to 1,000 µm. Through this process, the wafer was cleaved into bars each having individual laser devices arranged laterally next to one another. In a nitride semiconductor laser device in which a stripe is formed along the <1-100> direction, the end surfaces of the cavity are the {1-100} plane of the nitride semiconductor crystal. Cleaving was achieved not by engraving scribe lines over the entire surface of the wafer by the use of a scriber, but by engraving scribe lines only in part of the wafer, for example at opposite ends of the wafer or at places thereon corresponding to opposite ends of each chip, by the use of a scriber and then effecting cleaving by using those scribe lines as starting points. Feedback may be achieved otherwise than by means of end surfaces; for example, it may be achieved by means of diffraction gratings provided inside, a technique called DFB (distributed feedback), or by means of diffraction gratings provided outside, a technique called DBR (distributed Bragg reflector).

After the formation of the cavity end surfaces of the Fabry-Perrot cavity, dielectric films of SiO$_2$ and TiO$_2$ having a reflectivity of about 80% were alternately vapor-deposited on those end surfaces to form dielectric multiple-layer reflective films. The dielectric multiple-layer reflective films may be formed of any other dielectric material. Thereafter, each bar was separated into individual laser devices, and, in this way, the semiconductor laser device 1 shown in FIG. 1 was obtained. The laser light waveguide region 105 (ridge stripe) was located in the middle of the laser chip, and the laser device 1 had a lateral width W of 400 µm.

In the n-type GaN substrate 101 used to produce the device structure, dislocation-concentrated regions 102 were arranged at a pith P of 400 µm, high-luminescence regions 103 were arranged in the middle portions of low-dislocation regions, and laser light waveguide regions 105 were arranged so that their distance from the high-luminescence regions 103 was 80 µm and their distance t from the dislocation-concentrated regions 102 was 120 µm. Accordingly, each semiconductor laser device (chip) includes one dislocation-concentrated region and one high-luminescence region. That is, in this embodiment, W=P and 2(t+d)=P.

Through the procedure described above, the chip of the nitride semiconductor laser device 1 shown in FIGS. 1 and 3 was produced.

Characteristics of the Semiconductor Laser Device

The nitride semiconductor laser device 1 thus obtained had a narrowed-current portion located in an optimum position, achieving a life time of 5,000 hours or more under the following conditions: at a laser output power of 60 mW, and at an ambient temperature of 70° C. Incidentally, the inventors of the present invention also produced semiconductor lasers according to the prior art described earlier and tested them under the same conditions to find that they had lives of about 1,000 hours.

Embodiment 2

The semiconductor laser device of Embodiment 2 of the invention is similar to the semiconductor laser device 1 of Embodiment 1, and the difference between them lies in that the inclination angle of the surface of the n-type GaN substrate on which the device structure is laid is varied between 0° to 2°. The fabrication procedure here conforms to that for Embodiment 1. As described earlier in the "Fabrication Procedure of the GaN Substrate" section, the substrate 101 may have dislocation-concentrated regions arranged in a pattern of stripes, or may have dislocation-concentrated regions arranged in a pattern of dots in a nested fashion. In a case where the dislocation-concentrated regions has a pattern of dots, they do not necessarily have to be arranged in a nested fashion. More specifically, so long as the substrate has dislocation-concentrated regions in a state clearly distinguishable from low-dislocation regions and in addition, when seen from the direction perpendicular to the surface on which to grow a nitride semiconductor layer, the dislocation-concentrated regions have a smaller area than the low-dislocation regions, it can be used satisfactorily irrespective of the arrangement of the individual dislocation-concentrated regions.

Figure 5:
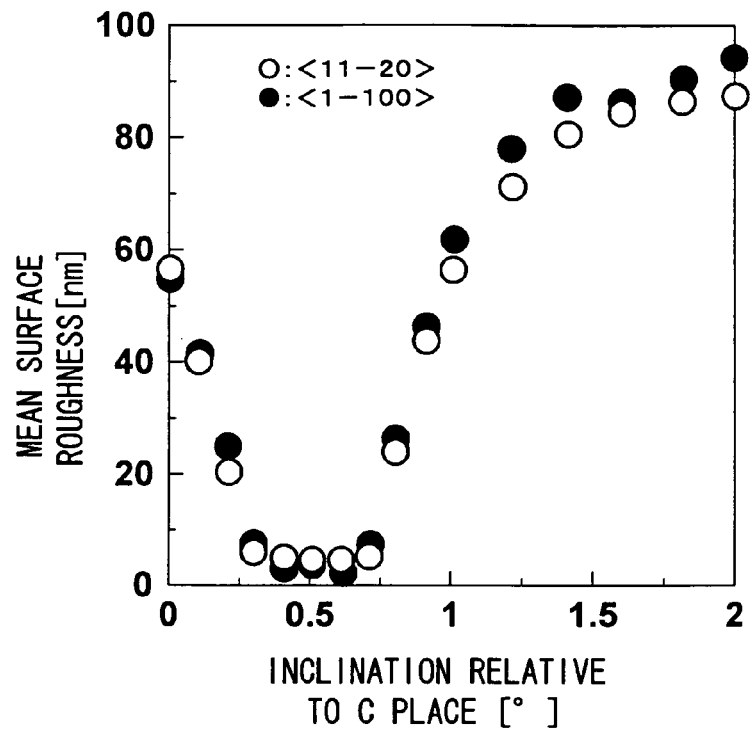
FIG. 5 is a diagram showing the relationship between the inclination of the substrate surface relative to the C plane and the mean surface roughness in the nitride semiconductor laser device of Embodiment 2 of the invention.

FIG. 5 shows the mean roughness of the epitaxial wafer surface as observed when its inclination was varied between 0° to 2° in the <11-20> and <1-100> directions relative to the C plane. Irrespective of the inclination direction, with the inclination angle in the range from 0° to less than 0.3°, projections having the shape of hexagonal pyramids developed on the wafer surface, and their diameters were about 200 to 400 µm. Because of these projections, the mean surface roughness as measured using a contact-probe-type step height tester at scanning intervals of 2 mm was 20 to 50 nm, which was ten or more times greater than the thickness of each of the well and barrier layers constituting the active layer, predicting degraded light emission characteristics of the active layer and a shorter life of the device.

With the inclination angle greater than 0.7°, the shape of the projections that developed on the epitaxial wafer surface changed from hexagonal pyramids, which were typically observed at small angles, to stripes with deep grooves, with the stripes, and thus also the grooves, lying at intervals of about 50 to 100 μm from one another. Since the grooves were deep, the mean surface flatness was greater than 50 nm, resulting in a very rough surface. By contrast, with the inclination angle in the range from 0.3° to 0.7°, no projections developed on the epitaxial surface, resulting in very satisfactory flatness. The mean surface flatness was about 10 nm, sufficiently small as compared with the thickness of a well or barrier layer. This indicates that the quantum well active layer was produced uniformly in the wafer surface.

Figure 6:
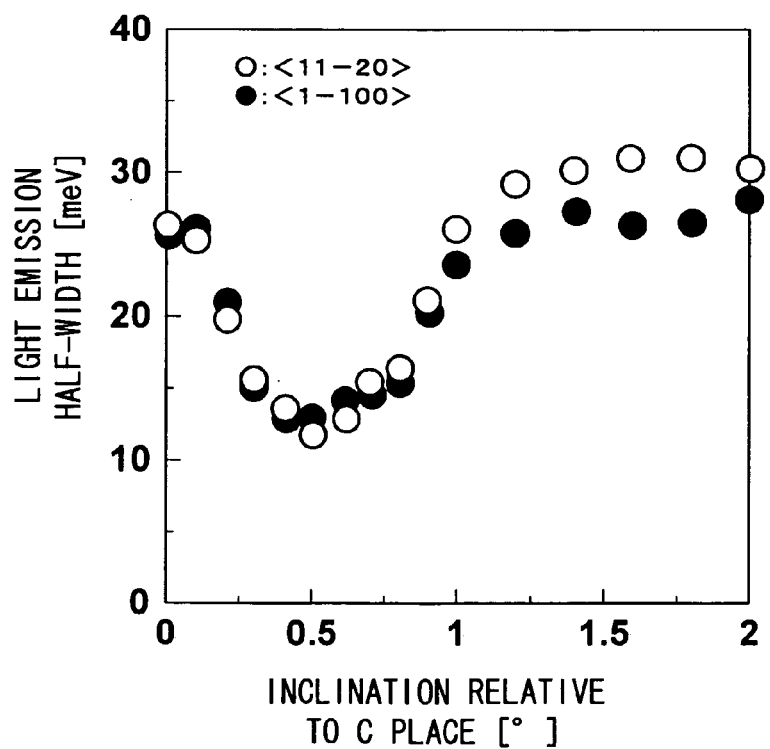
FIG. 6 is a diagram showing the relationship between the inclination of the substrate surface relative to the C plane and the FWHM of emitted light in the LED mode in the nitride semiconductor laser device of Embodiment 2.

FIG. 6 shows the FWHM (full width at half maximum) of emitted light plotted ageist the inclination angle, as observed when the same device as shown in FIG. 5 was energized to operate in the LED mode. In accordance with the surface morphology and the mean surface roughness, irrespective of the direction, light emission with a narrow FWHM was obtained with the inclination angle in the range from 0.3° to 0.7°. This means that determining the inclination angle within the range from 0.3° to 0.7° helps make the surface of the grown layer flat and form each interface inside the quantum well active layer steeply and uniformly. These effects probably eliminated agglomeration of In inside the active layer, resulting in sharp light emission with a narrow FWHM.

Figure 7:
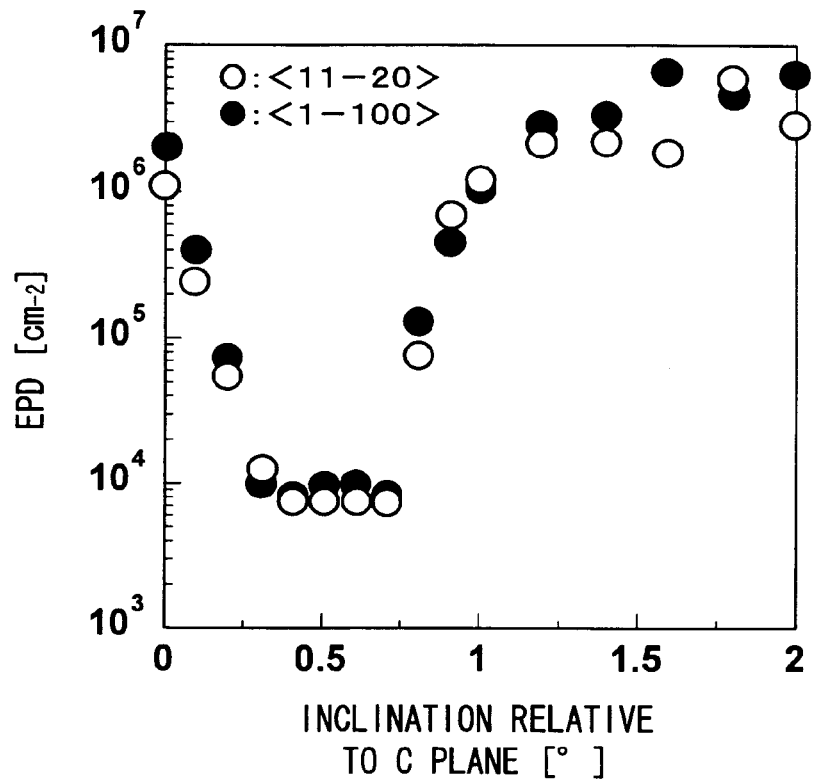
FIG. 7 is a diagram showing the relationship between the inclination of the substrate surface relative to the C plane and the EPD within a 200 μm width of the dislocation-concentrated region in the nitride semiconductor laser device of Embodiment 2.

FIG. 7 shows the etch pit density (EPD) plotted against the inclination angle as observed when the same device was subjected to etching in a mixture of phosphoric acid and sulfuring acid at 250° for 20 minutes before the formation of electrodes and the density of etch pits that appeared at the surface within the range of 200 μm of the dislocation-concentrated region was measured. In general, the pits that appear when a nitride semiconductor is etched are classified into two groups by their size, i.e., into small and large pits. It is considered that large pits correspond to blade-shaped dislocations and small pits to spiral, blade-shaped, and all other dislocations. In the embodiment being described, small pits, which correspond to all dislocations, were counted for evaluation. The figure shows that, in accordance with the enhancement of the surface flatness and of the light emission characteristics, irrespective of the direction, with the inclination angle in the range from 0.3° to 0.7°, the EPD dropped to levels of the order of $10^4$ cm$^{-2}$. When the same measurements were made with a substrate with no surface inclination, within the range of 200 μm of the dislocation-concentrated region, the EPD was at levels of the order of $10^7$ cm$^{-2}$. This indicates that, when the substrate is given no surface inclination, dislocations spread from the dislocation-concentrated region into the grown layer.

Considering the area of a semiconductor laser device, in general, if the EPD is $10^4$ cm$^{-3}$ or less, the number of dislocations included per device is one or less. Thus, giving the substrate a surface inclination is expected to prolong device lives.

The device of this embodiment produced with the inclination angle in the range from 0.3° to 0.7° had a life time of 5,000 hour or more under the following conditions: at a laser output power of 60 mW, and at an ambient temperature of 70° C. Moreover, because of the depressions resulting from the slower growth immediately above the dislocation-concentrated regions where the substrate surface was terminated with nitrogen atoms, the grown layer was divided at the pitch between adjacent dislocation-concentrated regions. This helped reduce the residual stress in the device, and thus helped achieve a lower crack density than in the conventional device structure, leading to an increased yield.

Embodiment 3

In Embodiment 3 of the invention, a GaN substrate that is given a surface inclination in the range from 0.3° to 0.7° as described in Embodiment 1 is used, and crystal growth is performed with only the thickness of the n-type layers varied to see how the EPD and the mean surface roughness vary. The purpose is to grasp the thickness needed to make the surface of the grown layer, grown on top of the substrate with a surface inclination, sufficiently flat to permit the quantum well active layer to be produced with satisfactory quality.

Figure 8:
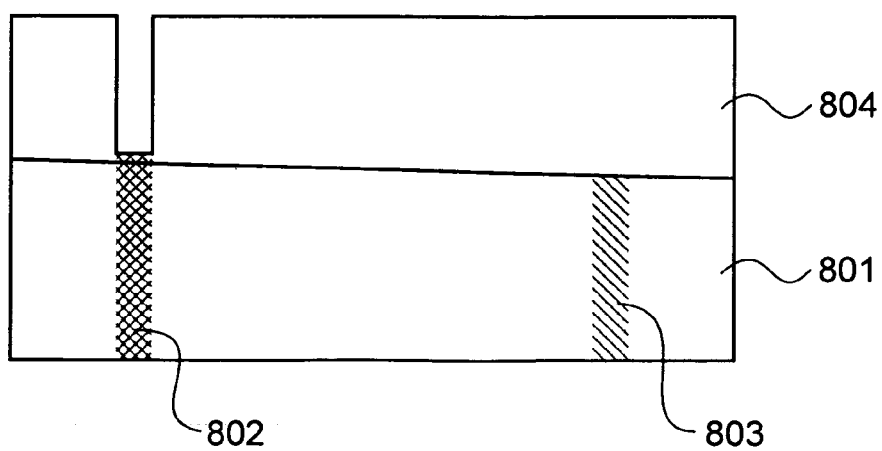
FIG. 8 is a sectional view schematically showing the substrate and the grown nitride semiconductor layer in Embodiment 3 of the invention.

How crystal growth is performed will be described with reference to FIG. 8. A GaN substrate 801 similar to that described in Embodiment 1 is used. As described earlier in the "Fabrication Procedure of the GaN Substrate" section, the substrate 801 may have dislocation-concentrated regions arranged in a pattern of stripes, or may have dislocation-concentrated regions arranged in a pattern of dots in a nested fashion. In a case where the dislocation-concentrated regions has a pattern of dots, they do not necessarily have to be arranged in a nested fashion. More specifically, so long as the substrate has dislocation-concentrated regions in a state clearly distinguishable from low-dislocation regions and in addition, when seen from the direction perpendicular to the surface on which to grow a nitride semiconductor layer, the dislocation-concentrated regions have a smaller area than the low-dislocation regions, it can be used satisfactorily irrespective of the arrangement of the individual dislocation-concentrated regions.

As described earlier in connection with Embodiment 1, the substrate 801 includes, as a part thereof, a dislocation-concentrated regions 802 and, as all the remaining part thereof, a low-dislocation region, and has, as a part of the low-dislocation region, a high-luminescence region 803 parallel to the dislocation-concentrated regions 802. Using a MOCVD machine, to $NH_3$ as a group V material and TMGa (trimethyl gallium) or TEGa (triethyl gallium) as a group III material, at a substrate temperature of 1,050° C., a GaN layer 804 was formed on top of the GaN substrate 801. Here, it is also possible to form first, before crystal growth at a high temperature about 1,000° C., a so-called low-temperature buffer layer at a comparatively low temperature of 500 to 700° C. and then raise the temperature to form the GaN layer 804 at a high temperature about 1,000° C.

Figure 9:
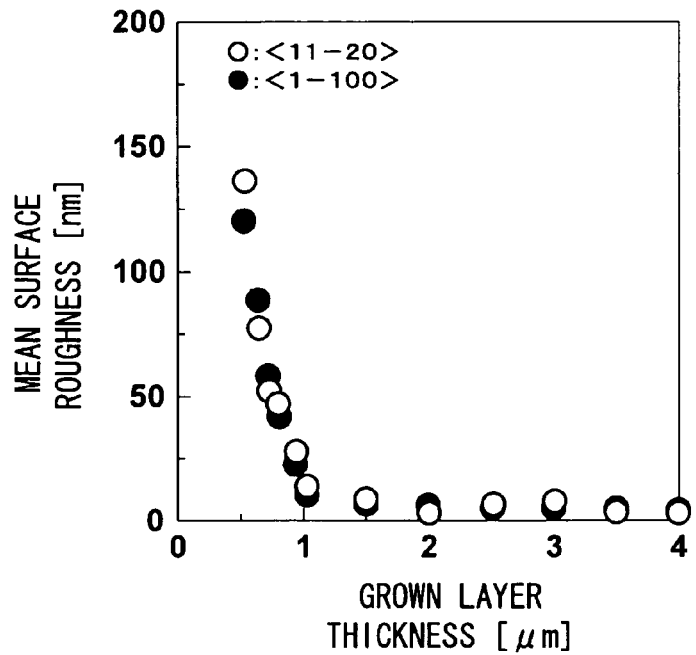
FIG. 9 is a diagram showing the relationship between the grown nitride semiconductor layer thickness and the mean surface roughness in Embodiment 3.

Through similar procedures, several samples in which the thickness of the GaN layer 804 was varied between 0.5 and 4 μm were produced, and first their mean surface roughness was measured using a step-height tester. As shown in FIG. 9, with the thickness of the GaN layer 804 less than 1 μm, the roughness was 10 nm or more. For example, in a case where a quantum well active layer is grown successively after the formation of the GaN layer, unless the GaN layer is 1 μm or more thick, the obtained surface flatness is expected to be insufficient, with no improvement in the light emission characteristics.

Why the GaN layer needs to be 1 μm or more thick to obtain sufficient flatness is not definitely known. One possible explanation is as follows. In the dislocation-concentrated region, the surface is terminated with nitrogen atoms. Thus, there, the materials are less stable than elsewhere where the surface is terminated with gallium, and accordingly the materials tend to be spewed out into where the surface is terminated with gallium. As a result, while the GaN layer is thin, the materials spewed out of the dislocation-concentrated region exhibit an uneven concentration distribution at the substrate surface. Thus, while the GaN layer is thin, surface irregularities are comparatively likely to develop.

Not only with GaN, but also with any nitride semiconductor of the composition $Al_xGa_yInN$ (where $0 \leq x \leq 1$, $0 \leq y \leq 1$, $0 \leq z \leq 1$, and $x+y+z=1$), when it was grown, the grown layer needed to be 1 μm or more thick to sufficiently reduce the mean surface roughness and the EPD.

Likewise, also when multiple layers of any compositions fulfilling $Al_xGa_yIn_zN$ (where $0 \leq x \leq 1$, $0 \leq y \leq 1$, $0 \leq z \leq 1$, and $x+y+z=1$) were laid, if the total thickness of the multiple layers was 1 μm or more, reductions was observed in the mean surface roughness and the EPD. Moreover, in all the cases described above, even when crystal growth was performed with an n- or p-type dopant added, the total thickness of the grown layer needed to be 1 μm or more to obtain sufficient flatness and to achieve a sufficient EPD reduction to produce a high-quality multiple quantum well active layer.

Embodiment 4

In Embodiment 4 of the invention, using a GaN substrate similar to the one used in Embodiment 1, a p-type nitride semiconductor layer is grown, and its p-type carrier concentration is measured. This is to show how the grown layer, as it is grown, is p-typified, without any post-processing performed.

Through a procedure similar to that used in Embodiment 3, a 3 μm thick GaN layer was grown, and then, immediately after it was taken out of the growth machine, hole measurement was performed to evaluate the concentration of p-type carriers. The thus measured p-type carrier concentration was $5 \times 10^{17}$ cm$^{-3}$, indicating that the grown layer, as it was grown, was p-typified. When the same sample was subjected to ordinary heat treatment, the carrier concentration increased to $7 \times 10^{17}$ cm$^{-3}$. The mechanism by which the grown layer, as it is grown, is p-typified is unknown. A possible explanation is that reduced dislocations inhibit the Mg taken into the crystal from binding to hydrogen, making passivation of the Mg difficult.

Not only with GaN, but also with any nitride semiconductor of the composition $Al_xGa_yIn_zN$ (where $0 \leq x \leq 1$, $0 \leq y \leq 1$, $0 \leq z \leq 1$, and $x+y+z=1$), when it was grown, the grown layer, as it was grown, was p-type, as was the case with GaN. As described earlier in the "Fabrication Procedure of the GaN Substrate" section, the substrate 101 may have dislocation-concentrated regions arranged in a pattern of stripes, or may have dislocation-concentrated regions arranged in a pattern of dots in a nested fashion. In a case where the dislocation-concentrated regions has a pattern of dots, they do not necessarily have to be arranged in a nested fashion. More specifically, so long as the substrate has dislocation-concentrated regions in a state clearly distinguishable from low-dislocation regions and in addition, when seen from the direction perpendicular to the surface on which to grow a nitride semiconductor layer, the dislocation-concentrated regions have a smaller area than the low-dislocation regions, it can be used satisfactorily irrespective of the arrangement of the individual dislocation-concentrated regions.

Embodiment 5

In Embodiment 5 of the invention, the nitride semiconductor laser device 1 having a ridge-stripe structure described in connection with Embodiment 1 is replaced with a nitride semiconductor laser device 2 having a current blocking layer. Now, the nitride semiconductor laser device 2 of this embodiment having a current blocking layer will be described with reference to FIG. 10.

In the semiconductor laser device 2 of this embodiment, on top of an n-type GaN substrate 1001, there are laid the following layers on one another in the order mentioned: an n-type GaN layer 1002, an n-type $In_{0.07}Ga_{0.93}N$ crack prevention layer 1003, an n-type $Al_{0.1}Ga_{0.9}N$ cladding layer 1004, an n-type GaN light guiding layer 1005, an active layer 1006, a p-type $Al_{0.2}Ga_{0.8}N$ carrier blocking layer 1007, a p-type GaN light guiding layer 1008, a p-type $Al_{0.1}Ga_{0.9}N$ first cladding layer 1009a, a current blocking layer 1010, a p-type $Al_{0.1}Ga_{0.9}N$ second cladding layer 1009b, a p-type InGaN contacting layer 1011, a p-electrode 1012, and an n-electrode 1013.

Figure 10:
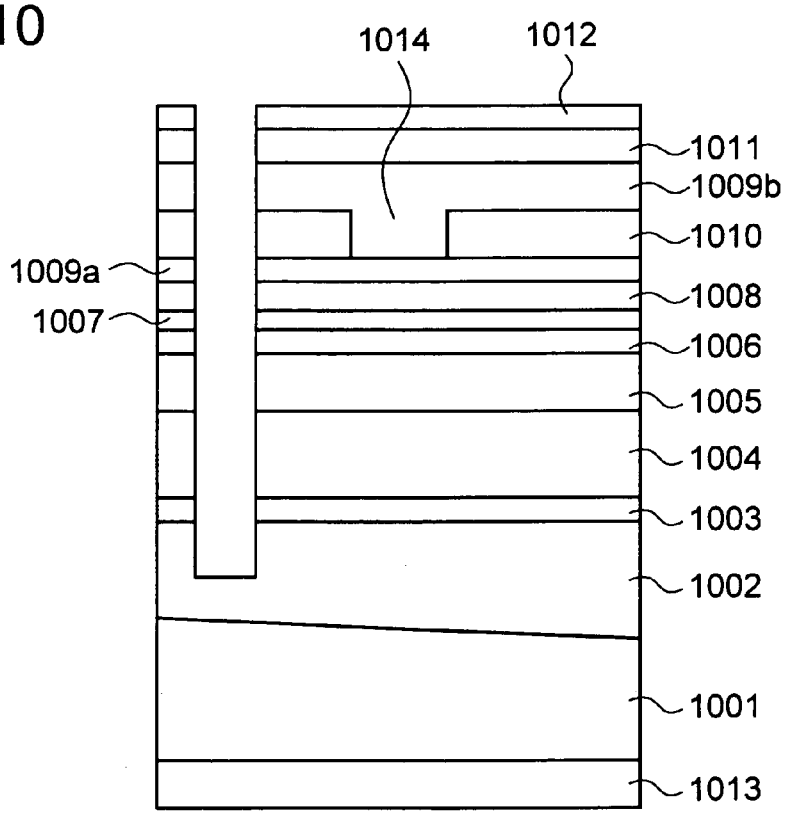
FIG. 10 is a sectional view schematically showing the layer structure of the semiconductor laser device of Embodiment 5 of the invention.

The current blocking layer 1010 is so laid as to block the current injected from the p-electrode 1012 in such a way that the current passes only through a width secured between divided parts of the current blocking layer 1010 as shown in FIG. 10. For example, the current blocking layer 1010 may be a layer of $Al_{0.25}Ga_{0.75}N$. The current blocking layer 1010 may have any Al content other than 0.25. In this embodiment, the opening in the current blocking layer 1010 serves as a laser light guiding region 1014, functioning like the one provided in Embodiment 1.

As described earlier in the "Fabrication Procedure of the GaN Substrate" section, the substrate 1001 may have dislocation-concentrated regions arranged in a pattern of stripes, or may have dislocation-concentrated regions arranged in a pattern of dots in a nested fashion. In a case where the dislocation-concentrated regions has a pattern of dots, they do not necessarily have to be arranged in a nested fashion. More specifically, so long as the substrate has dislocation-concentrated regions in a state clearly distinguishable from low-dislocation regions and in addition, when seen from the direction perpendicular to the surface on which to grow a nitride semiconductor layer, the dislocation-concentrated regions have a smaller area than the low-dislocation regions, it can be used satisfactorily irrespective of the arrangement of the individual dislocation-concentrated regions.

Embodiment 6

In Embodiment 6 of the invention, at least one element selected from the group of As, P, and Sb is added to the active layer of the nitride semiconductor laser device 1 or 2. All the other features are as already described.

In this embodiment, at least one element selected from the group of As, P, and Sb is added at least to the well layers included in the active layer 305 or 1006 laid in the nitride semiconductor laser device 1 or 2. Here, let the total content of the elements belonging to the above-mentioned group in the well layers be X, and let the content of the element N in the well layers be Y. Then, X is smaller than Y, and in addition $X/(X+Y)$ is equal to or smaller than 0.3 (30%), and preferably equal to or smaller than 0.2 (20%). The lower limit of the total content of the elements belonging to the above-mentioned group is $1 \times 10^{18}$ cm$^{-3}$ or more.

As the content X exceeds 20%, concentration separation starts to occur, in which the contents of the individual elements vary from one region to another within the well layers. As the content X exceeds 30%, the concentration separation starts to shift to crystal system separation, in which a hexagonal crystal coexists with a cubic crystal, causing the crystallinity of the well layers to start to degrade. On the other hand, as the total content of the elements of the above-mentioned group drops below $1\times10^{18}$ cm$^{-3}$, it becomes difficult to obtain the benefits of adding the above-mentioned elements to the well layers.

The benefits of this embodiment lie in that adding As, P, or Sb to the well layers helps reduce the effective masses of electrons and holes in the well layers and helps increase the mobility of electrons and holes in the well layers. In a semiconductor laser device, the former benefit means that a carrier inversion distribution for laser oscillation can be obtained through injection of less current, and the latter benefit means that, even when electrons and holes in the active layer disappear as a result of their recombination for light emission, new electrons and holes are injected at a high rate by diffusion. That is, as compared with conventionally reported In GaN nitride semiconductor laser devices that contain none of the elements As, P, and Sb in their active layer, the nitride semiconductor laser device of this embodiment offers a low threshold current density and excellent noise characteristics.

As described earlier in the "Fabrication Procedure of the GaN Substrate" section, the substrate 1001 may have dislocation-concentrated regions arranged in a pattern of stripes, or may have dislocation-concentrated regions arranged in a pattern of dots in a nested fashion. In a case where the dislocation-concentrated regions has a pattern of dots, they do not necessarily have to be arranged in a nested fashion. More specifically, so long as the substrate has dislocation-concentrated regions in a state clearly distinguishable from low-dislocation regions and in addition, when seen from the direction perpendicular to the surface on which to grow a nitride semiconductor layer, the dislocation-concentrated regions have a smaller area than the low-dislocation regions, it can be used satisfactorily irrespective of the arrangement of the individual dislocation-concentrated regions.

Embodiment 7

In Embodiment 7 of the invention, when the individual nitride semiconductor layers are formed on top of the substrate, a selective growth technique is used. In all the other respects, this embodiment is the same as any of the thus far described embodiments.

A selective growth technique is one whereby a mask formed of a material that retards growth (for example, an oxide such as SiO$_2$ or a nitride such as SiN or AlN) and having openings formed therein is formed on the substrate beforehand so that, when the nitride semiconductor layers are formed on the substrate, growth proceeds in the lateral direction at an early stage of growth. This helps effectively prevent cracks that may develop as the nitride semiconductor layers are grown. The mask may be formed so as to lay above the dislocation-concentrated region 102 and the high-luminescence region 103, or independently of those regions. It is preferable to lay the mask at least immediately below the laser light waveguide region 105, because it helps effectively prevent cracks that may develop in the laser light waveguide region 105.

Embodiments 1 to 7 thus far described all deal with cases where GaN is used as the substrate, but the substrate may be replaced with a nitride semiconductor substrate formed of any of the materials mentioned earlier in the "SUMMARY OF THE INVENTION" section. The materials of the nitride semiconductor layers grown on the nitride semiconductor substrate also may be replaced with any of the nitride semiconductor materials mentioned earlier in the "SUMMARY OF THE INVENTION" section.

Embodiment 8

In Embodiment 8 of the invention, a nitride semiconductor laser device according to the invention is applied to a semiconductor optical apparatus.

When a nitride semiconductor laser device according to the invention (with an oscillation wavelength of 330 to 550 nm) is used in a semiconductor optical apparatus such as an optical pickup apparatus, it offers the following benefits. Any nitride semiconductor laser device according to the invention yields high output (30 mW), operates stably even in a high-temperature environment (60° C.), and offers a long life. This makes it suitable for use in a disc apparatus designed for high-density recording and reproduction, where high reliability is sought (the shorter the wavelength, the higher the density with which recording and reproduction are possible).

Figure 11:
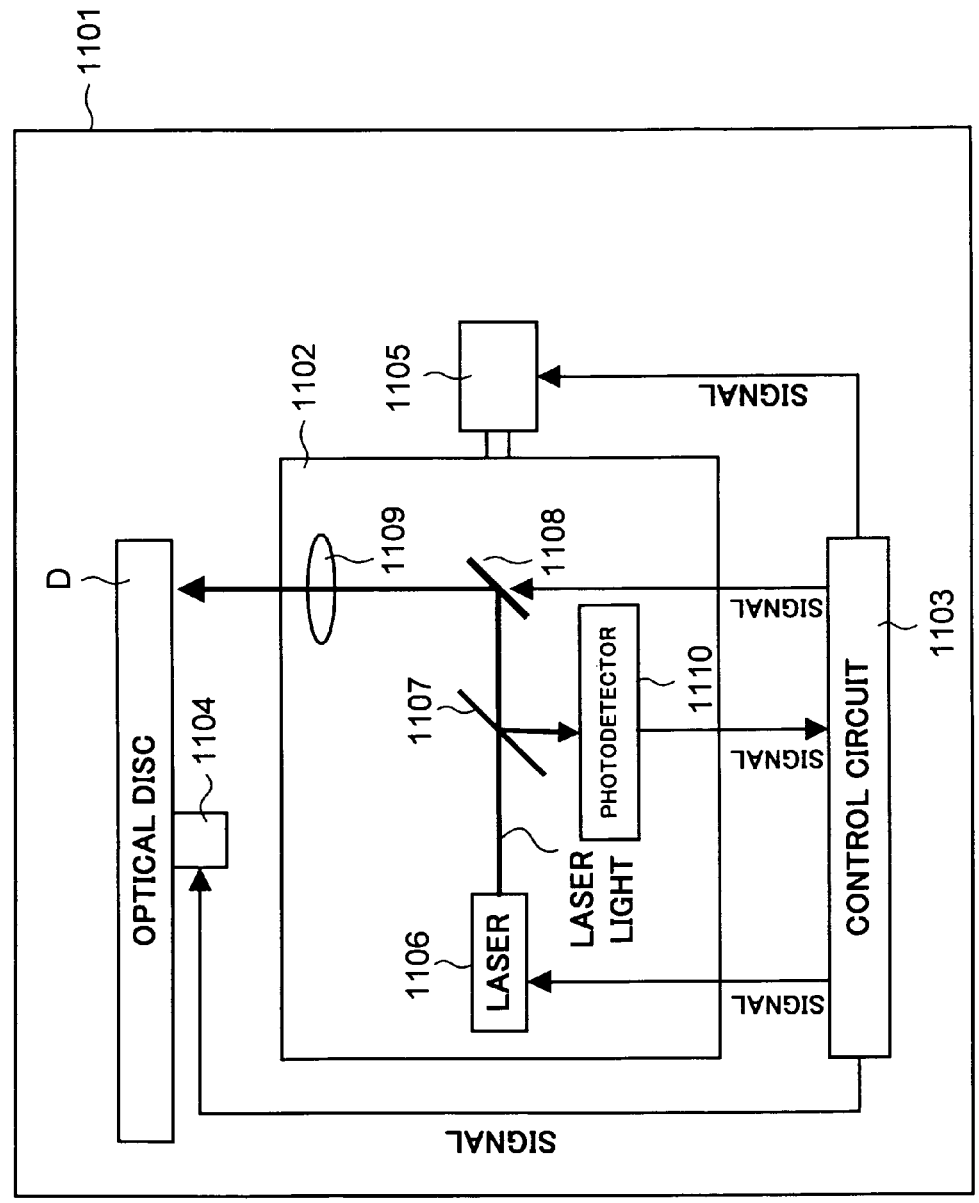
FIG. 11 is a block diagram showing an outline of the construction of the semiconductor optical apparatus of Embodiment 8 of the invention.

FIG. 11 shows an outline of the configuration of, as an example of a semiconductor optical apparatus to which a nitride semiconductor laser device according to the invention is applied, an optical disc apparatus (an apparatus having an optical pickup, for example a DVD apparatus). The optical disc apparatus 1101 includes an optical pickup 1102, a control circuit 1103, a motor 1104 for rotating a disk D, and a motor 1105 for moving the optical pickup 1102. The optical pickup 1102 includes a semiconductor laser device 1106, a beam splitter 1107, a mirror 1108, an objective lens 1109, and a photodetector 1110. Used as the semiconductor laser device 1106 here is the nitride semiconductor laser device 1 or 2 of any of the embodiments described thus far.

For recording of information, the laser light L emitted from the semiconductor laser device 1106 is modulated by the control circuit 1103 according to input information, then travels through the beam splitter 1107, mirror 1108, and objective lens 1109, and then converges on the recording surface of the disk D, achieving the recording of information to the disk D. Alternatively, while the semiconductor laser device 1106 is emitting unmodulated laser light L, the magnetic field in the portion on the recording surface of the disk D on which the laser light L converges is modulated according to input information. This too achieves the recording of information. For reproduction of information, laser light L optically varied according to the pits arranged on the disk D travels through the objective lens 1109, mirror 1108, and beam splitter 1107 to enter the photodetector 1110, by which the laser light L is converted into a reproduced signal. The power of the laser light L outputted from the semiconductor laser device 1106 is, for example, about 30 mW for recording and about 5 mW for reproduction.

Semiconductor laser devices according to the invention can be used, not only in optical disc apparatuses having an optical pickup apparatus as the one just described, but also in laser printers, bar code readers, projectors involving laser of three primary colors (blue, green, and red), and the like, and are thus suitable as high-output, long-life light sources.

Embodiment 9

In general, a substrate formed of a nitride semiconductor includes about $5\times10^7$ cm$^2$ of crystal defects at the substrate surface. By using a means for bending, eliminating, or otherwise treating such crystal defects, it is possible to obtain low-defect regions and thereby secure a sufficiently long life in high-output power aging. Moreover, good crystallinity and uniform planer distribution on the substrate or in the crystal layer grown on top of the substrate help enhance light emission efficiency, reduce variations in characteristics, and increase yields.

Figure 12:
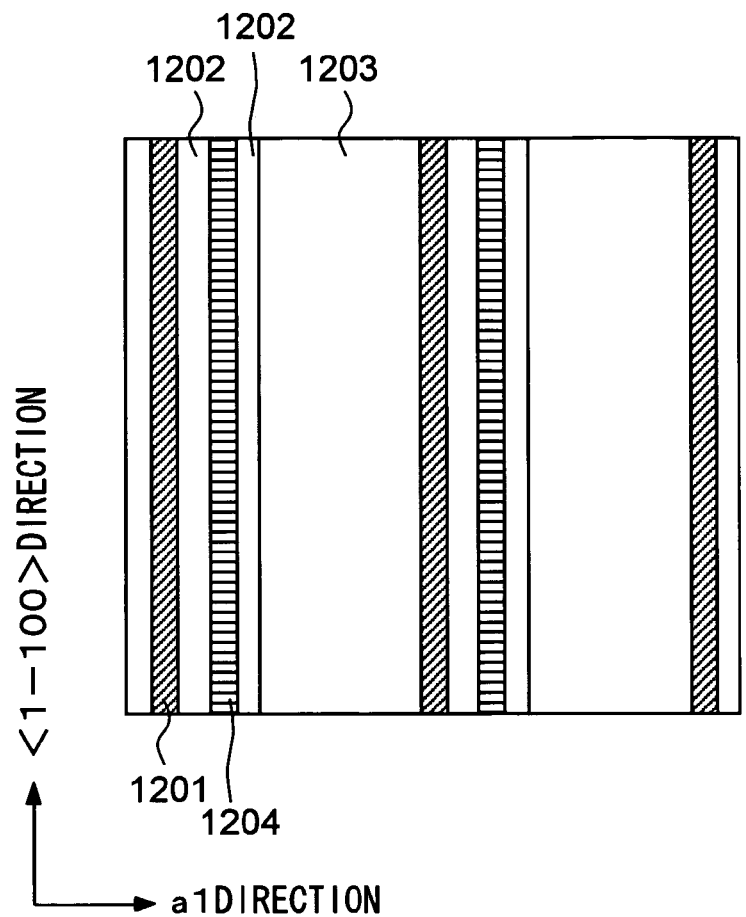
FIG. 12 is a top view of the wafer having the ridge-stripe portions formed thereon in Embodiment 9 of the invention.
Figure 13:
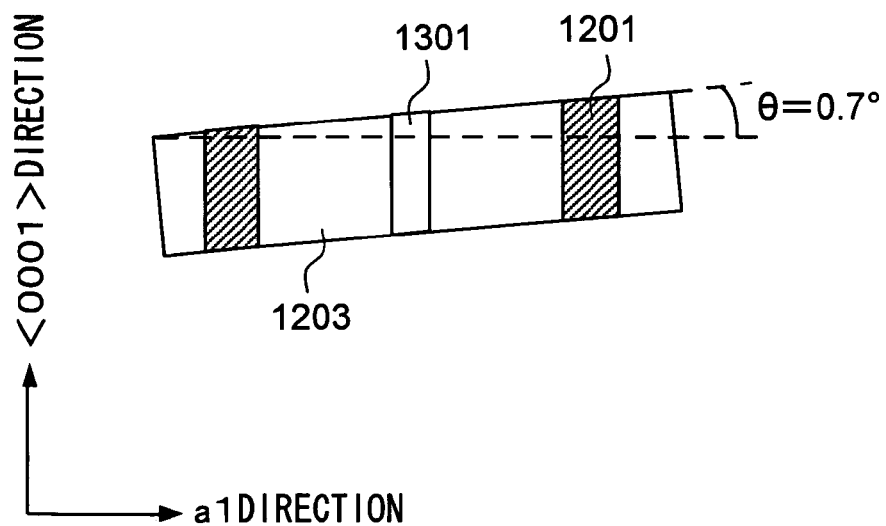
FIG. 13 is a sectional view of the GaN substrate in Embodiment 9.
Figure 14:
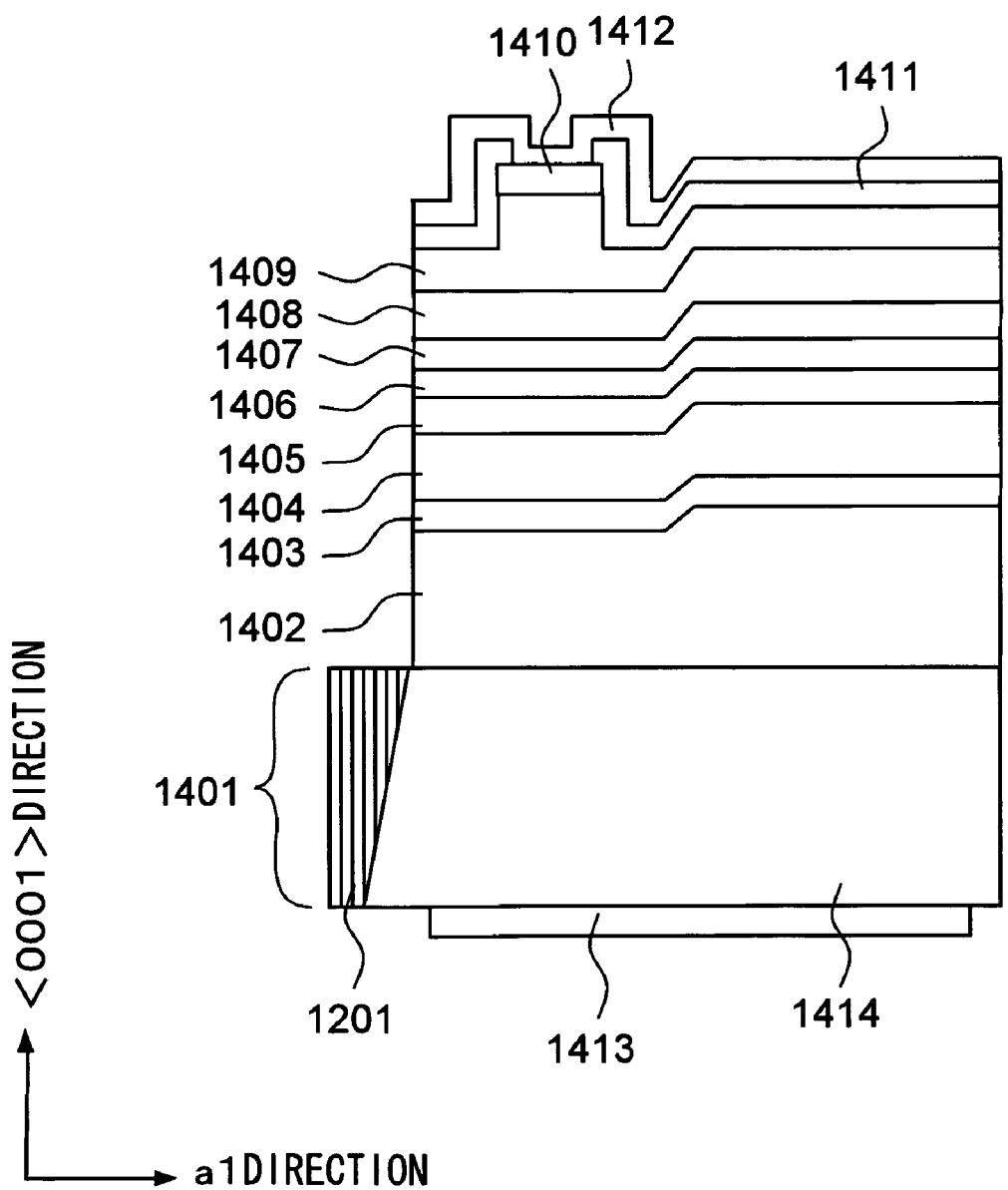
FIG. 14 is a sectional view of the laser diode device in Embodiment 9.
Figure 15A:
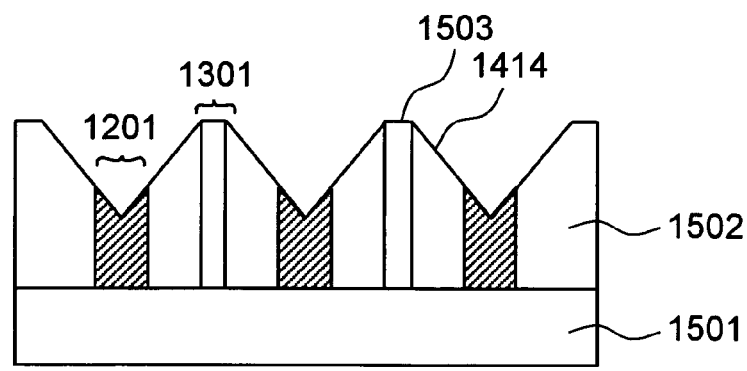
FIG. 15(a) is a sectional view of a principal portion of the support base member having the n-type GaN layer laid thereon.
Figure 15B:
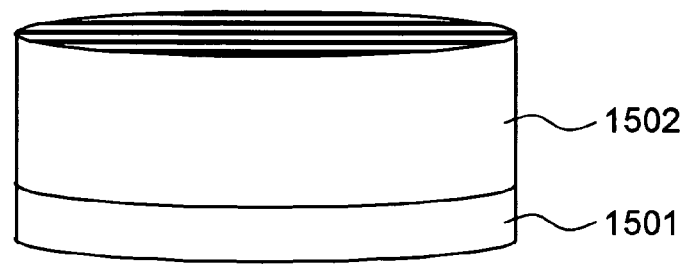
FIG. 15(b) is a diagram showing the ingot.
Figure 15C:
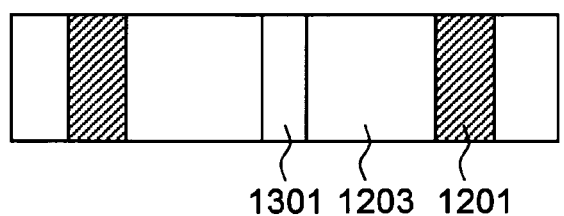
FIG. 15(c) is a sectional view of a principal portion of the n-type GaN layer.
Figure 15D:
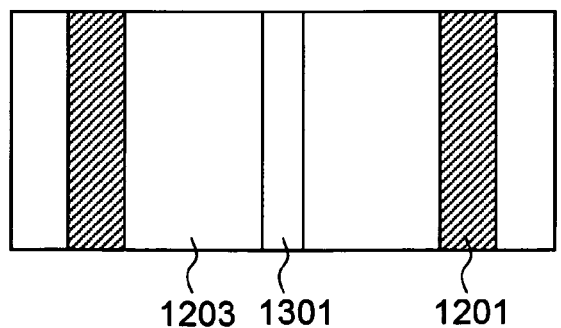
FIG. 15(d) is a top view of a principal portion of the n-type GaN layer.

FIG. 12 is a top view of the wafer as observed after the ridge-stripe portions 1204 of Embodiment 9 of the invention are formed thereon. FIG. 13 is a sectional view of the GaN substrate of Embodiment 9. FIG. 14 is a sectional view of the laser diode of Embodiment 9.

In the GaN substrate, there exist defect-concentrated regions in a pattern of stripes along the <1-100> direction, and, as the other regions than those, there exist low-defect regions and parts where the {0001} facet is exposed. The top surface of the GaN substrate has an off-angle relative to the C plane, and the off-angle is 0.7° in the direction perpendicular to the stripes of the defect-concentrated regions (i.e., in the a1 direction) and is 0.3° in the direction parallel thereto (i.e., in the <1-100> direction).

Fabrication Procedure of the GaN Substrate

Now, the fabrication procedure of the n-type GaN substrate 1401 will be described with reference to FIG. 15. FIG. 15(*a*) is a sectional view of a principal portion of a support base member 1501 having an n-type GaN layer 1502 laid on top thereof. On the support base member 1501, the n-type GaN layer 1502 is grown by HVPE (hydride vapor phase epitaxy) in such a way that chiefly the {11-22} facet 1414 is exposed at the surface during growth. This causes the surface to have a sawtooth-shaped section with ridges and troughs. Near the tops of the ridges, however, is slightly exposed the {0001} plane 1503 in the shape of stripes.

Used as the support base member 1501 is a two-inch (111) GaAs wafer. The ridges and troughs have a periodic structure with a pitch P of 400 μm, and have a shape that extends, like ridges in a crop field, in the depth direction of the figure. To determine where to locate these ridges and troughs, a mask of SiO$_2$ or the like having opening corresponding to the troughs may be formed beforehand on the substrate so that crystal growth proceeds with the facets kept exposed. That is, the openings of the mask are arranged in a pattern of stripes arranged parallel to the ≦1-100> direction of the GaN crystal with a pitch P of 400 μm. Thus, the openings may have the shape of continuous stripes, or may be composed of dot-shaped openings arranged in rows. The technique of (and the conditions for) maintaining crystal growth with the {11-22} facet kept exposed is disclosed in detail in Japanese Patent Application Laid-Open No. 2001-102307. The grown crystal was made n-type by being doped with O while growing.

By continuing the growth of the GaN crystal with this growth mode maintained, a 30 mm high ingot was produced on top of the support base member 1501. FIG. 15(*b*) shows the ingot.

Using a slicer, this ingot was sliced into thin pieces (each an n-type GaN substrate). The thin piece was then polished to produce a flat-surfaced n-type GaN substrate 1401 measuring two inches in diameter and 350 μm in thickness. The surface for epitaxial growth was specularly polished. As shown in FIG. 13, the GaN substrate is so produced that the top surface thereof has an off-angle of 0.7° in the direction perpendicular to and 0.3° in the direction parallel to the stripes of the defect-concentrated regions 1201.

Here, a preferred range of the off-angle in the perpendicular direction is from 0.2° to 2°, both ends inclusive, and a preferred range thereof in the parallel direction is 2° or less. The off-angle in the parallel direction may be just zero (0°), but is preferably other than that, because it then makes uniform the width of the uniformly-light-emitting regions 1202. Moreover, it is preferable that the off-angle in the parallel direction be equal to or smaller than that in the perpendicular direction.

FIG. 15(*c*) is a sectional view of a principal portion of the n-type GaN substrate 1401 thus produced, and FIG. 15(*d*) is a top view of a principal portion of the n-type GaN substrate 1401. This n-type GaN substrate 1401 was evaluated in the following manner.

When the surface of the n-type GaN substrate 1401 was closely inspected under a microscope, it was observed to be, though polished, not perfectly flat, but had small depressions in regions corresponding to those where the bottommost parts of the troughs were located during crystal growth. Then, the sample was etched by being dipped in a mixture of sulfuric acid and phosphoric acid heated to 250° C. so that etch pits appeared at the surface. As a result, in regions corresponding to those where the bottommost parts of the troughs were located during crystal growth, many etch pits appeared, attesting that those regions were where defects (or dislocations) were highly concentrated (i.e., defect-concentrated regions 1201). That is, the depressions mentioned above corresponded to these regions. As described above, the regions in which depressions were observed had highly concentrated dislocations, and thus were more easily eroded than other regions. This probably is the reason that the depressions were formed there. The defect-concentrated regions were about 10 to 50 μm wide. All the other regions were low-defect regions 1203 with EPDs (etch pit densities) of the order of $10^2$ to $10^5$ cm$^{-2}$. The defect-concentrated regions 1201 were observed to have three or more orders of magnitude greater EPDs.

Moreover, with the sample irradiated with ultraviolet rays (the 365 nm spectral line of a Hg lamp can be used), the luminescence from the surface was observed under a microscope (fluorescence microscopy). As a result, in about the middle portions of the low-defect regions 1203 sandwiched between the defect-concentrated regions 1201, stripe-shaped regions 1301 were observed that had comparatively clear boundaries and that had different contrast from the adjoining regions. These regions exhibit more intense light emission (luminescence), which can be observed with the naked eye, than the adjoining regions, and are observed to be yellowish and bright. These regions 1301 are the parts which grew with the {0001} facet exposed during crystal growth. One of the probable reasons that these regions are observed to appear different from the adjoining regions is that the dopant is absorbed differently there than in the adjoining regions. On the basis of the facts described above, in the present specification, these regions are called "high-luminescence regions." During crystal growth, the parts that grow with the {0001} facet exposed do not always advance uniformly with a constant width. Thus, the width of the high-luminescence regions 1301 was about 0 to 30 μm, with slight fluctuations. It should be noted that the high-luminescence regions 1301 are omitted in FIGS. 12 and 14.

The formation of the GaN substrate 1401 may be achieved by any vapor-phase crystal growth process other than HVPE; it may be formed, for example, by MOCVD (metalorganic chemical vapor deposition), MOVPE (metalorganic chloride vapor phase epitaxy), or sublimation.

Used as the support base member 1501 on which to grow the GaN substrate may be, instead of GaAs, a monocrystalline substrate that has sixfold or threefold symmetry about an axis. That is, a monocrystal with hexagonal symmetry or cubic symmetry can be used. With a cubic-symmetry crystal, using the (111) plane results in threefold symmetry. Examples of hexagonal-symmetry crystals that can be used include sapphire, SiC, SiO$_2$, NdGaO$_3$, ZnO, GaN, AlN, and ZrB$_2$. Examples of cubic-symmetry crystals of which a (111) plane substrate can be used include Si, spinel, MgO, and GaP. With these, GaN is grown on the C plane.

The mask that is used in the formation of the GaN substrate 1401 is laid by one of the following two methods. By one method, the mask is formed directly on the substrate. In this case, it is advisable to take a preparatory step prior to epitaxial growth as by depositing a GaN buffer layer on the surface where the substrate will be exposed through the openings in the mask. By the other method, a comparatively thin GaN layer is formed beforehand on the substrate, and then the mask is formed on top. In many cases, the latter method proves to be preferable, permitting smooth progress of growth.

Epitaxial Growth of the Nitride Semiconductor Layer

Next, how a nitride semiconductor layer etc. are formed on top of the n-type GaN substrate 1401 to fabricate a semiconductor laser device will be described with reference to FIG. 14.

First, using a MOCVD machine, using $NH_3$ as a group V material and TMGa (trimethyl gallium) or TEGa (triethyl gallium) as a group III material, using $SiH_4$ as a dopant material, and using hydrogen or nitrogen as a material carrier gas, at a substrate temperature of 1,050°, a 3 μm thick n-type GaN layer 1402 was formed on the n-type GaN substrate 1401. Next, at a substrate temperature of 800° C., with TMIn (trimethyl indium) as a group III material added to the already mentioned materials, a 40 nm thick n-type $In_{0.07}Ga_{0.93}N$ crack prevention layer 1403 was formed. Next, the substrate temperature was raised to 1,050° C., and, using TMAl (trimethyl aluminum) or TEAl (triethyl aluminum) as a group III material, a 1.2 μm thick n-type $Al_{0.1}Ga_{0.9}N$ cladding layer 1404 was formed. The dopant material was so prepared as to contain, as the n-type impurity used in these steps, $5 \times 10^{17}/cm^3$ to $1 \times 10^{19}/cm^3$ of Si. Subsequently, a 0.1 μm thick n-type GaN light guiding layer 1405 (with a Si impurity concentration of $1 \times 10^{16}/cm^3$ to $1 \times 10^{18}/cm^3$) was formed.

Thereafter, the substrate temperature was lowered to 750° C., and an active layer (multiple quantum well structure) 1406 composed of 4 nm thick $In_{0.1}Ga_{0.9}N$ well layers and 8 nm thick $In_{0.01}Ga_{0.99}N$ barrier layers that are laid alternately on one another in three periods in the following order: a barrier layer, a well layer, a barrier layer, a well layer, a barrier layer, a well layer, and then a barrier layer. Meanwhile, $SiH_4$ (with a Si impurity concentration of $10^{16}$ to $10^{18}/cm^3$) was introduced into the barrier layers or to both the barrier and well layers. It is preferable to suspend the growth for a period of one second or more but less than 180 seconds between adjacent barrier and well layers or between adjacent well and barrier layers, because this helps enhance the flatness of the individual layers and helps reduce the FWHM (full width at half maximum) of emitted light. A preferred material used to add As to the active layer is $AsH_3$ (arsine), TBAs (tertiary butyl arisine), or TMAs (trimethyl arisine); a preferred material used to add P to the active layer is $PH_3$ (phosphine), TBP (tertiary butyl phosphine), or TMP (trimethyl phosphine); a preferred material used to add Sb to the active layer is TMSb (trimethyl antimony) or TESb (triethyl antimony). Used as the N material in the formation of the active layer may be, instead of $NH_3$, a hidrazine material such as dimethyl hydrazine, or azide material such as ethyl azide.

In a case where the active layer includes $In_xGa_{1-x}N$ quantum wells formed in a plurality of layers, or in a case where As or P is added to the active layer to form a quantum well active layer, it is known that, if there are threading dislocations in the quantum wells, In segregates at the dislocations. Accordingly, in a case where the active layer includes quantum wells containing $In_xGa_{1-x}N$ as main component elements, it is essential to minimize dislocations (defects) to obtain satisfactory laser characteristics.

Next, the substrate temperature was raised back to 1,050° C., and a 20 nm thick p-type $Al_{0.3}Ga_{0.7}N$ carrier blocking layer 1407, a 0.1 μm thick p-type GaN light guiding layer 1408, a 0.5 μm p-type $Al_{0.1}Ga_{0.9}N$ cladding layer 1409, and a 0.1 μm thick p-type GaN contacting layer 1410 were formed in this order. As the p-type impurity used in these steps, $EtCp_2Mg$ (bisethylcyclopentadienyl magnesium) was used as a material, and was added so that the Mg concentration was $10^{18}$ to $2 \times 10^{20}$ $cm^{-3}$. As the Mg material here, it is also possible to use another cyclopenta Mg material such as cyclopentadienyl magnesium or bismethylcyclopentadienyl magnesium. It is preferable that the p-type impurity concentration in the p-type GaN contacting layer 1410 increase toward a p-electrode 1412. This helps reduce the contact resistance due to the formation of the p-electrode. Moreover, to eliminate the residual hydrogen in the p-type layers which impedes the activation of Mg used as the p-type impurity, a trace amount of oxygen may be mixed during the growth of the p-type layers.

After the p-type GaN contacting layer 1410 was grown in this way, all the contents inside the reactor of the MOCVD machine were replaced with nitrogen carrier gas and $NH_3$, and the temperature was lowered at a rate of 60° C. per minute. When the substrate temperature became 800° C., the supply of $NH_3$ was stopped, and then, after this substrate temperature was maintained for five minutes, it was lowered further to room temperature. Here, a preferred range of temperature at which the substrate is maintained is from 650° C. to 900° C., and a preferred range of duration for which that temperature is maintained is from three to ten minutes. A preferred rate at which the temperature is lowered is 30° C. or more per minute. The grown film thus produced was evaluated by Raman measurement, with the following results. Thanks to the procedure described above, after the wafer was taken out of the MOCVD machine, even without p-typifying annealing, the grown film exhibited p-type properties (the activation of Mg) immediately after growth. In addition, the contact resistance due to the formation of the p-electrode was low. Combining the above technique with conventional p-typifying annealing proved to be preferable, because it led to enhanced Mg activation.

The n-type $In_{0.07}Ga_{0.93}N$ crack prevention layer 1403 may have an In content other than 0.07, or the entire InGaN crack prevention layer may be omitted. To prevent cracks, instead of Si, Ge may be used as an n-type impurity.

The active layer 1406 starts with a barrier layer and ends with a barrier layer; instead, it may start with a well layer and end with a well layer. The number of well layers formed may be any other than three as specifically described above; so long as the number is ten or less, a low threshold current density permitted continuous wave operation at room temperature. Two or more but six or less layers were particularly preferable, because of a low threshold current density. The active layer may further contain Al.

In the active layer 1406, a necessary amount of Si was added to both the well and barrier layers. This impurity does not necessarily have to be added, but adding an impurity such as Si to the active layer resulted in more intense light emission. The impurity may be, other than Si, at least one selected from the group of impurities consisting of O, C, Ge, Zn, and Mg. A preferred total amount of impurities added is about $10^{17}$ to $8 \times 10^{18}/cm^3$. The impurity may be added to, instead of both the well and barrier layers, the well layers alone or the barrier layers alone.

The p-type $Al_{0.3}Ga_{0.7}N$ carrier blocking layer 1407 may have a composition other than this specific composition. Using AlGaN having In added thereto is preferable, because it becomes p-type even when grown at a lower temperature, and thus helps alleviate the damage inflicted on the active layer during crystal growth. The entire carrier blocking layer may be omitted, but providing it leads to a lower threshold current density. This is because the carrier blocking layer serves to confine carriers inside the active layer. Increasing the Al content in the carrier blocking layer is preferable, because it permits carriers to be confined more powerfully. By contrast, reducing the Al content down to a level that barely maintains confinement of carriers is also preferable, because it increases the carrier mobility inside the carrier blocking layer and thereby reduces the electrical resistance.

Here, an $Al_{0.1}Ga_{0.9}N$ crystal was used as each of the p-type cladding layer 1409 and the n-type cladding layer 1404. Instead, an AlGaN ternary crystal with an Al content other than 0.1 may be used. As the Al content in the mixed crystal increases, the differences in energy gap and in refractive index from the active layer increase. This permits more efficient confinement of carriers and light in the active layer, leading to a lower threshold current density. By contrast, reducing the Al content down to a level that barely maintains the confinement of carriers and light, it is possible to increase the mobility of carriers in the cladding layer and thereby lower the operating voltage of the device.

A preferred range of the thickness of the n-type AlGaN cladding layer 1404 is from 0.7 µm to 1.5 µm. This helps achieve a unimodal vertical lateral mode, increased light confinement efficiency, enhanced laser optical characteristics, and a lower threshold current density.

In the above description, an AlGaN ternary crystal was used as each of the p-type cladding layer 1409 and the n-type cladding layer 1404. Instead, a quaternary crystal such as AlInGaN, AlGaNP, or AlGaNAs may be used. For a reduced electrical resistance, the p-type cladding layer 1409 may be given a superlattice structure composed of a p-type AlGaN layer and a p-type GaN layer, or a superlattice structure composed of a p-type AlGaN layer and a p-type InGaN layer.

The description above deals with a case where the crystal was grown by using a MOCVD machine. It is, however, also possible to use molecular beam epitaxy (MBE) or hydride vapor phase epitaxy (HVPE).

The subsequent process is one for taking out the epitaxial wafer having the individual layers of the nitride semiconductor layer formed on top of the n-type GaN substrate 1401 as described above out of the MOCVD machine and then forming it into individual nitride semiconductor laser device chips. Here, in FIG. 14, the p-type cladding layer 1409 has an elevated portion, which is the shape formed through the process described later. In Embodiment 9, on the surface of the epitaxial wafer on completion of the formation of nitride semiconductor laser devices, in the regions consisting of low-defect regions 1203 sandwiched between defect-concentrated regions 1201 and parts 1301 that had grown with the {0001} facet 1503 kept exposed, uniformly-light-emitting regions 1202 were obtained that extended within a width of about 120 µm of the low-defect regions 1201 in the a1 direction (in FIG. 14, the rightward direction). The thickness of these uniformly-light-emitting regions 1202 was about 200 Å smaller than that of the other parts of the low-defect regions 1203. Why the uniformly-light-emitting regions 1202 are obtained is not definitely known, but they are obtained where there are stripe-shaped defect-concentrated regions 1201 and in addition there is an off-angle in the direction perpendicular to the stripes of the defect-concentrated regions 1201. By further producing an appropriate off-angle also in the direction parallel to the defect-concentrated regions 1201, it is possible to make substantially constant the width of the uniformly-light-emitting regions 1202.

Figure 16:
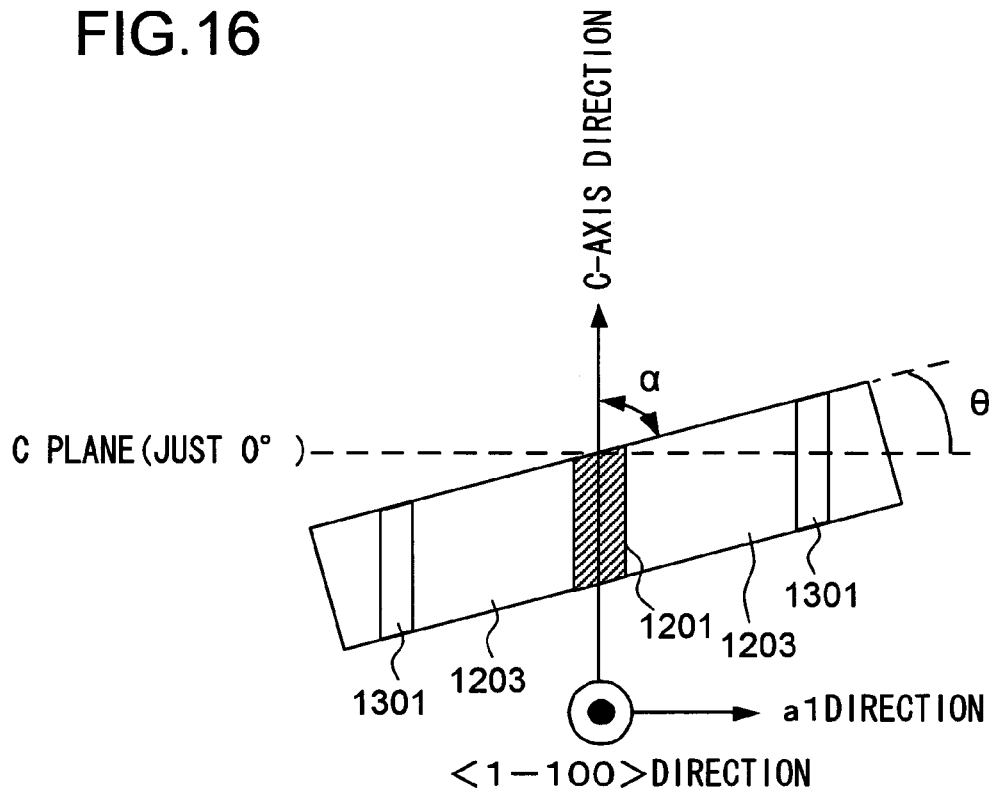
FIG. 16 is a sectional view of a principal portion of a GaN substrate having an off-angle relative to the C plane.

FIG. 16 is a sectional view of a principal portion of the n-type GaN substrate 1401 having an off-angle relative to the C plane, showing the relationship between the top surface of the GaN substrate 1401 and the C-axis direction as observed in the direction perpendicular to the stripes of the defect-concentrated regions 1201. Of the two directions perpendicular to the stripes of the defect-concentrated regions 1201, the one in which the C axis forms, in the direction perpendicular thereto, an acute angle a to the surface of the GaN substrate is the a1 direction. In FIG. 16, the a1 direction is indicated as the rightward direction.

The uniformly-light-emitting regions 1202 are obtained in the a1 direction with respect to the defect-concentrated regions 1201. Moreover, the shape of the uniformly-light-emitting regions 1202 depends on the direction of the off-angle. This is because the magnitude of the off-angle in the a1 direction affects the direction, width, and depth in and with which the uniformly-light-emitting regions 1202 are obtained, and the magnitude of the off-angle in the parallel direction affects the width of the uniformly-light-emitting regions 1202.

The tendency is that, the greater the off-angle in the direction (a1 direction) perpendicular to the defect-concentrated regions 1201, the narrower and deeper the uniformly-light-emitting regions 1202, and therefore that, the gentler the inclination, the wider and shallower the uniformly-light-emitting regions 1202. The off-angle in the direction parallel to the defect-concentrated regions 1201 makes substantially constant the width of the uniformly-light-emitting regions 1202. However, there is a tendency that, the shaper the inclination in the parallel direction, the smaller the width of the uniformly-light-emitting regions 1202. If this off-angle in the parallel direction is just or nearly zero, the width of the uniformly-light-emitting regions 1202 is not constant but tends to vary greatly between about 50 µm to 250 µm. These facts indicate that increasing the off-angle both in the perpendicular and parallel directions makes it impossible to obtain satisfactory uniformly-light-emitting regions. Thus, it is preferable that the off-angle in the direction perpendicular to the stripe-shaped defect-concentrated regions 1201 be equal to or greater than 0.2° but equal to or smaller than 2°, and that the off-angle in the parallel direction be equal to or smaller than 2°. Moreover, to secure a sufficient and substantially uniform width to produce ridge-stripe portions 1204 or narrowed-current portions on the uniformly-light-emitting regions 1202, it is preferable that the off-angle in the parallel direction be smaller than that in the perpendicular direction.

Moreover, in the regions within about 30 µm of the edges of the defect-concentrated regions 1201, there remain strains in the shape of the defect-concentrated regions 1201 and strains nearby, producing portions elevated as compared with the uniformly-light-emitting regions 1202. On the other hand, right above the defect-concentrated regions 1201, where epitaxial growth of a nitride semiconductor is more difficult, depressions develop. The nitride semiconductor laser devices thus produced were, just as the GaN substrate was, inspected under a fluorescence microscope, with the following result. Except in regions where the high-luminescence regions and the defect-concentrated regions 1201 had poor morphology, the uniformly-light-emitting regions 1202 emitted light substantially over the entire surface thereof.

Producing Individual Devices

Ridge-stripe portions for confining light in a direction parallel to the substrate were formed in positions 70 μm away from the defect-concentrated regions 1201 on the uniformly-light-emitting regions 1202 of the epitaxial wafer described above. In a case where a substrate having high-luminescence regions as described above is used, it is preferable that ridge-stripe portions be formed somewhere else than in those regions. This is because the high-luminescence regions have a lower dopant content or a lower degree of dopant activation and thus has higher resistivity than other regions, producing a distribution in the current that is injected into the laser device. Even on the surface of the uniformly-light-emitting regions 1202, in parts thereof near the defect-concentrated regions 1201, the surface of the epitaxial wafer is elevated. Thus, it is preferable to form ridge-stripe portions 1204 in positions 40 μm or more away from the defect-concentrated regions 1201.

The ridge-stripe portions 1204 are formed by performing etching from the wafer to the middle of the p-type cladding layer 1409 so as to leave stripe-shaped portions. Here, the stripes are 1 to 3 μm wide, and preferably 1.3 to 2 μm wide; the distance from the p-type guiding layer 1408 to the etching bottom surface was 0.1 to 0.4 μm. Thereafter, an insulating film 1411 was formed elsewhere than where the ridge-stripe portions 1204 were located. Here, the insulating film 1411 was formed of AlGaN. The p-type GaN contacting layer 1410 left unetched was exposed, and therefore, on this portion and on the insulating film 1411, a p-electrode 1412 was formed by vapor-depositing Pd/Mo/Au in this order.

The insulating film 1411 may be formed, instead of the material mentioned above, an oxide or nitride of silicon, titanium, zirconia, tantalum, aluminum, or the like. The combination of materials for the p-electrode may be, instead of the one mentioned above, Pd/Pt/Au, Pd/Au, Ni/Au, or the like.

Then, the reverse side (substrate side) of the epitaxial wafer was polished to adjust its thickness to 80 to 200 μm so that the wafer would later be easier to separate.

On the reverse side of the substrate, an n-electrode 1413 was formed in the order Hf/Al. The combination of the materials for the n-electrode may instead be Hf/Al/Mo/Au, Hf/Al/Pt/Au, Hf/Al/W/Au, Hf/Au, Hf/Mo/Au, or a modified version of any of these where Hf is replaced with Ti or Zr.

Lastly, the above epitaxial wafer is cleaved in the direction perpendicular to the ridge stripe direction to produce Fabry-Perrot cavities with a cavity length of 500 μm. A preferred range of the cavity length is from 300 μm to 1,000 μm. Through this process, the wafer is cleaved into bars each having individual laser devices arranged laterally next to one another. In nitride semiconductor laser devices in which the direction of ridge stripes is formed along the <1-100> direction, the end surfaces of the cavity are the {1-100} plane of the nitride semiconductor crystal. Cleaving is achieved not by engraving scribe lines over the entire surface of the wafer by the use of a scriber, but by engraving scribe lines only in part of the wafer, for example at opposite ends of the wafer, by the use of a scriber and then effecting cleaving by using those scribe lines as starting points. Feedback in the laser cavity may be achieved otherwise than in the manner described above; for example, it may be achieved by a well-known technique such as DFB (distributed feedback) or DBR (distributed Bragg reflector).

After the formation of the cavity end surfaces of the Fabry-Perrot cavities, dielectric films of $SiO_2$ and $TiO_2$ having a reflectivity of about 70% are alternately vapor-deposited on those end surfaces to form dielectric multiple-layer reflective films. The dielectric materials may instead be $SiO_2/Al_2O_3$. Thereafter, each bar is separated into individual laser devices, and, in this way, the semiconductor laser device shown in FIG. 3 is obtained. The laser light waveguide region (ridge stripe) was located on the uniformly-light-emitting region, and the laser device had a lateral width W (the width of each laser after being separated from the bar) of 400 μm. On the original n-type GaN substrate 1401, there are arranged defect-concentrated regions 1201 at a pitch P of 400 μm. The defect-concentrated regions 1201 are not needed on laser chips, and therefore the separation may be effected so that those regions are excluded. In this case, it is preferable that cleaving be performed so that the cleavage planes be 10 μm or more away from the laser light guide regions (ridge stripes), and it is further preferable that cleaving be performed so that the elevated regions near the defect-concentrated regions 1201 be excluded. In this way, the nitride semiconductor laser chip shown in FIG. 14 is produced.

Characteristics of the Semiconductor Laser Device

The characteristics of the above nitride semiconductor laser device were measured, with the following result. The life time of 5,000 hours or more was achieved under the following conditions: at a laser output of 60 mW, and at an ambient temperature of 70° C.

Embodiment 10

Figure 17:
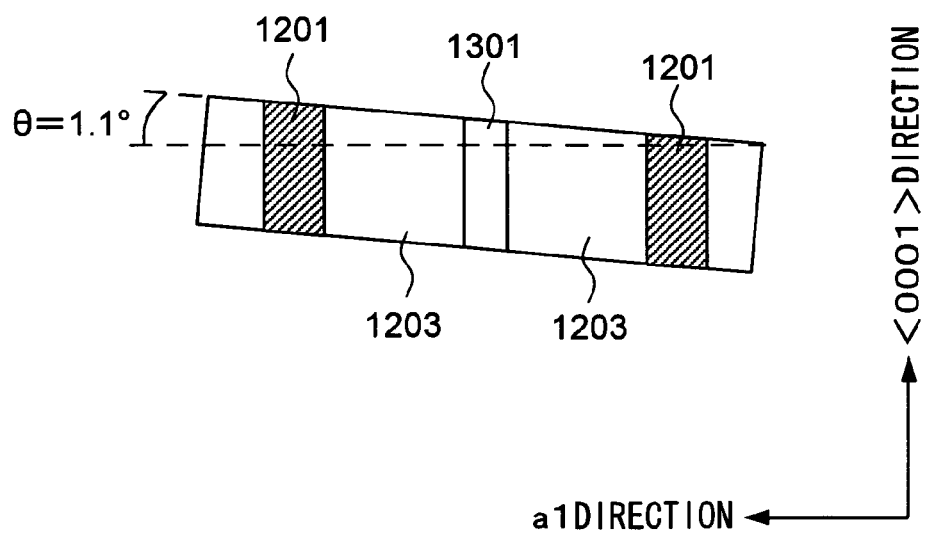
FIG. 17 is a sectional view of the GaN substrate in Embodiment 10 of the invention.
Figure 18:
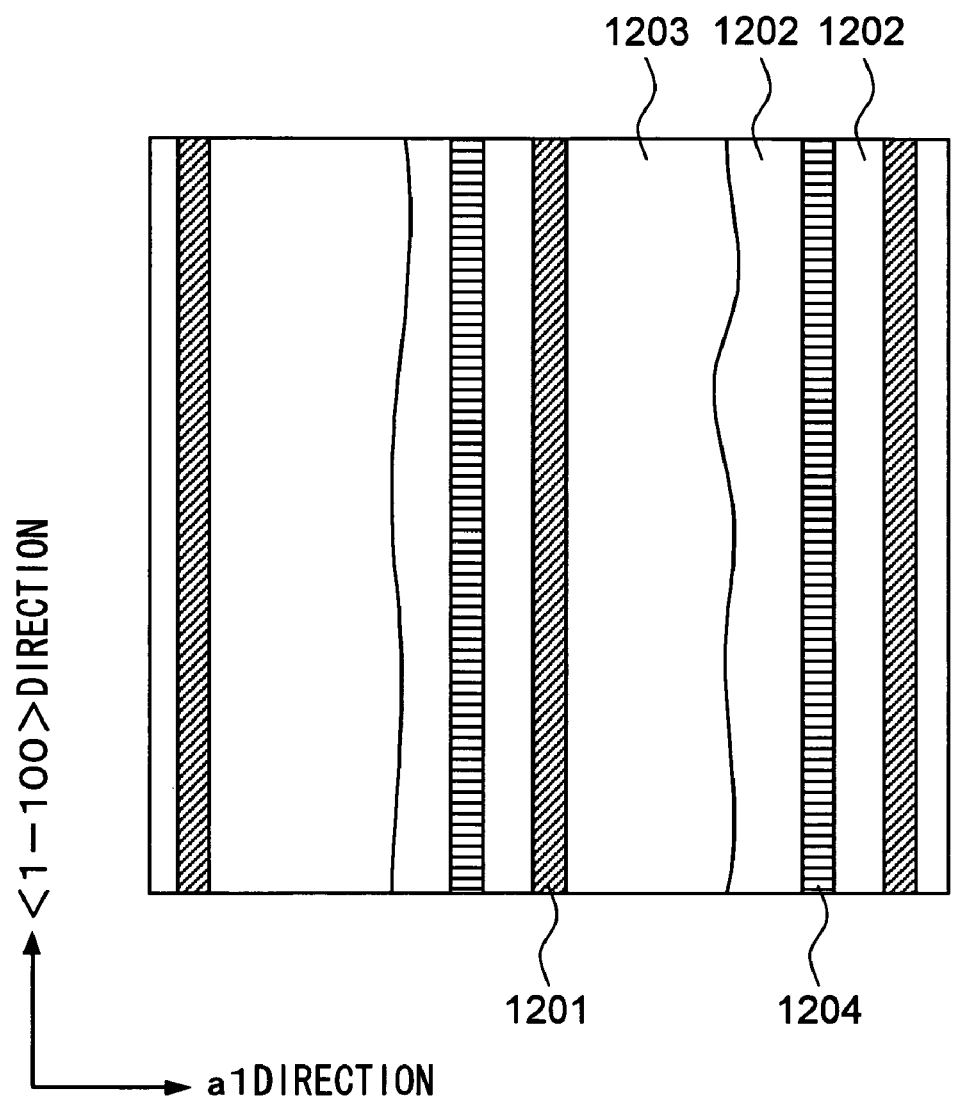
FIG. 18 is a top view of the wafer having the ridge-stripe portions formed thereon in Embodiment 10.
Figure 19:
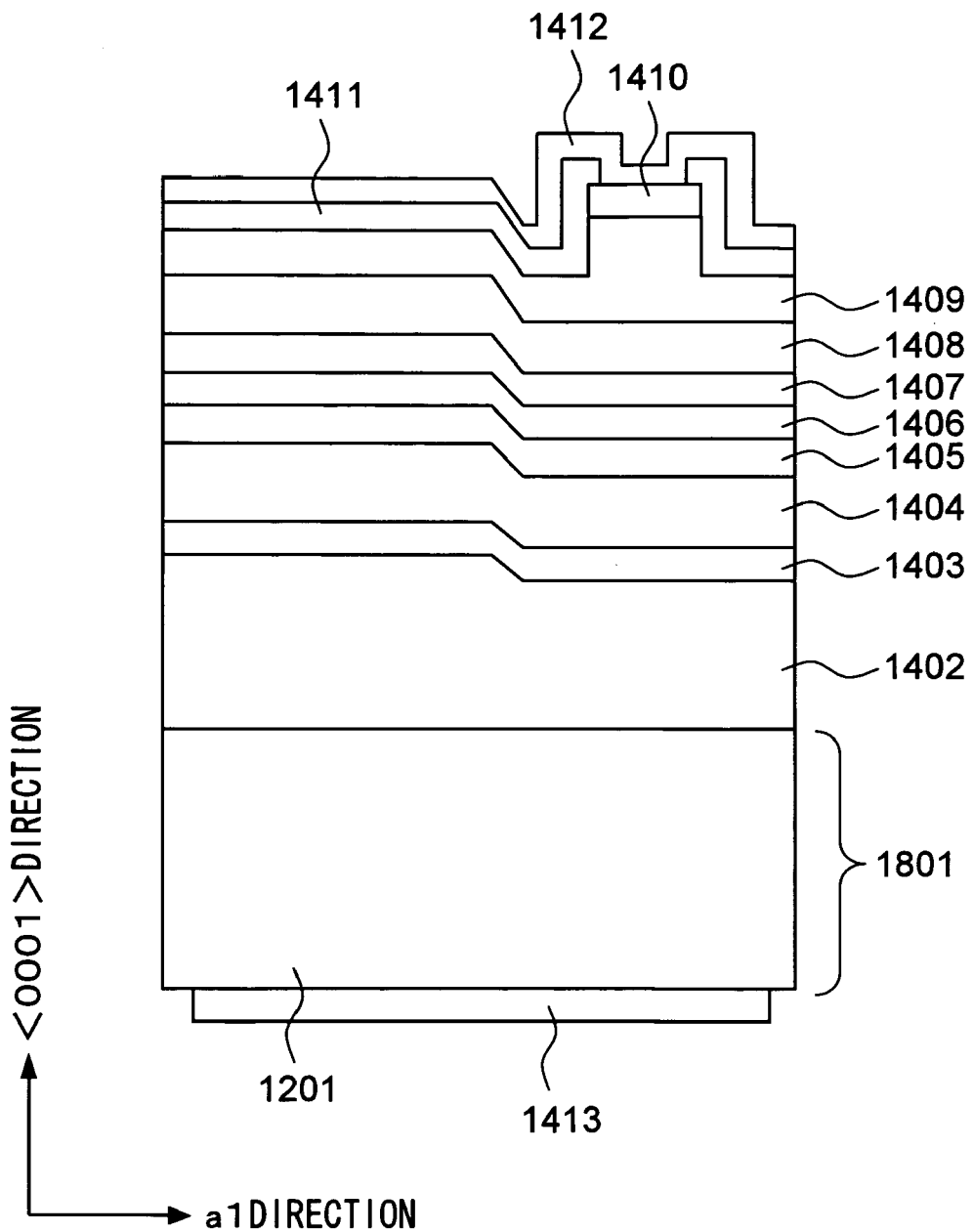
FIG. 19 is a sectional view of the laser diode device in Embodiment 10.

FIG. 17 is a sectional view of the GaN substrate of Embodiment 10 of the invention. FIG. 18 is a top view of the wafer after the formation of the ridge stripe portions 1204 of Embodiment 10. FIG. 19 is a sectional view of the laser diode of Embodiment 10. In FIG. 17, the a1 direction is the leftward direction.

In Embodiment 10, the top surface of the GaN substrate having defect-concentrated regions arranged with a pitch of 500 μm in the <1-100> direction is the C plane, and has an off-angle of 1.1° in the direction (the a1 direction) perpendicular to the stripes of the defect-concentrated regions and 0.5° in the direction (the <1-100> direction) parallel thereto. In all the other respects, the structure here is the same as in Embodiment 9.

As in Embodiment 9, on top of the GaN substrate 1801 are formed, at a substrate temperature of 1,050° C., the following layers on one another in the order named: a 3 μm thick n-type GaN layer 1402, a 1 μm thick n-type $Al_{0.1}Ga_{0.9}N$ cladding layer 1403, and a 0.1 μm thick n-type GaN light guiding layer 1404. Subsequently, at 750° C., an active layer (multiple quantum well structure) 1406 composed of 4 nm thick $In_{0.1}Ga_{0.9}N$ well layers and 8 nm thick $In_{0.01}Ga_{0.99}N$ barrier layers that are laid alternately on one another in five periods in the following order: a barrier layer, a well layer, a barrier layer, a well layer, a barrier layer, a well layer, and then a barrier layer. Next, the substrate temperature is raised back to 1,050° C., and a 20 nm thick p-type $Al_{0.3}Ga_{0.7}N$ carrier blocking layer 1407, a 0.1 μm thick p-type GaN light guiding layer 1408, a 0.5 μm p-type $Al_{0.1}Ga_{0.9}N$ cladding layer 1409, and a 0.1 μm thick p-type GaN contacting layer 1410 are formed in this order. On the top surface of the nitride semiconductor laser devices grown in this way, as shown in FIG. 18, uniformly-light-emitting regions 1202 were obtained with a width of 80 μm in the a1 direction with respect to the defect-concentrated regions 1201.

Subsequently, ridge-stripe portions 1204 were formed above the uniformly-light-emitting regions 1202, 60 μm away from the edges of the defect-concentrated regions 1201. Then, with the lateral width W of each laser device determined to be 400 μm so as not to include the defect-concentrated regions 1201, separation was performed so as to obtain the designed cavity length (600 µm). In the separation process, it is preferable that the cleavage planes be 10 µm or more away from the ridge-stripe portions, and it is further preferable that the elevated regions near the defect-concentrated regions 1201 be excluded from the chips. In Embodiment 10, separation was effected at positions 40 µm and 440 µm away from the defect-concentrated regions 1201 in the a1 direction, so that the produced chips each had a width W of 400 µm.

Embodiment 11

Figure 20:
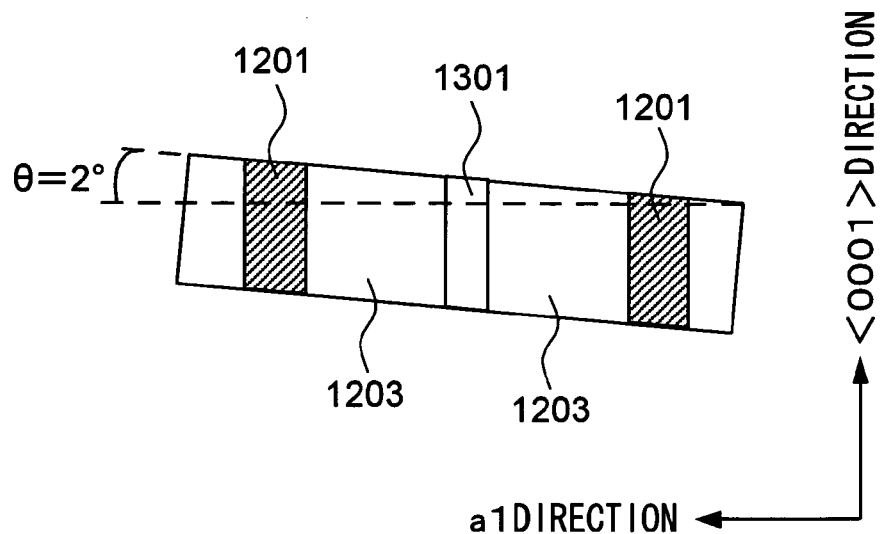
FIG. 20 is a sectional view of the GaN substrate in Embodiment 11 of the invention.
Figure 21:
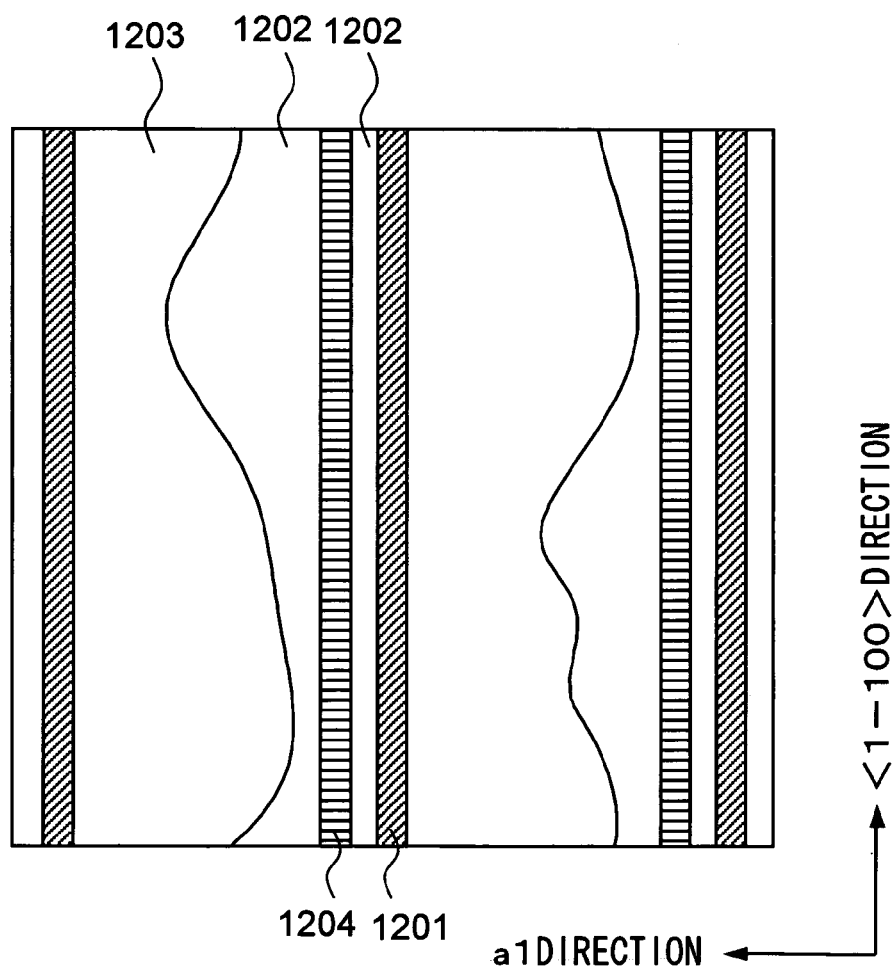
FIG. 21 is a top view of the wafer having the ridge-stripe portions formed thereon in Embodiment 11.

FIG. 20 is a sectional view of the GaN substrate of Embodiment 11 of the invention, and FIG. 21 is a top view of the wafer after the formation of the ridge-stripe portions 1204 of Embodiment 11.

In Embodiment 11, the off-angle is 0.2° in the direction (the a1 direction) perpendicular to the stripes of the defect-concentrated regions 1201 and just zero (0°) in the direction parallel thereto. In all the other respects, the structure here is the same as in Embodiment 9.

The width of the obtained uniformly-light-emitting regions 1202 fluctuated between about 80 µm to 200 µm in the a1 direction with respect to the defect-concentrated regions 1201. It is when the off-angle in the parallel direction is just or nearly zero that the width of the uniformly-light-emitting regions 1202 fluctuates. Ridge-stripes are formed above the uniformly-light-emitting regions 1202, 60 µm away from the edges of the defect-concentrated regions 1201.

Embodiment 12

In Embodiment 12, the off-angle is 2° in the direction (the a1 direction) perpendicular to the stripes of the defect-concentrated regions 1201 and 2° in the direction (the <1-100> direction) parallel thereto. In all the other respects, the structure here is the same as in Embodiment 9.

The obtained uniformly-light-emitting regions 1202 had a width of about 50 µm in the perpendicular direction (the a1 direction) from the edges of the defect-concentrated regions 1201 with respect to the stripes of the defect-concentrated regions 1201. Ridge-stripe portions 1204 are formed above the uniformly-light-emitting regions 1202, 40 µm away from the edges of the defect-concentrated regions 1201.

In Embodiments 10 to 12, the same device characteristics as in Embodiment 9 were obtained.

What is claimed is:

1. A nitride semiconductor light-emitting device formed from a nitride semiconductor wafer comprising a plurality of nitride semiconductor layers disposed on top of a nitride semiconductor substrate, wherein the nitride semiconductor substrate is a GaN substrate having, in a surface thereof on which the plurality of nitride semiconductor layers are disposed, a plurality of stride-shaped dislocation-concentrated regions terminated with nitrogen, and a region, other than dislocation-concentrated regions, terminated with gallium, wherein the surface of the nitride semiconductor substrate on which the plurality of nitride semiconductor layers are disposed has a C plane that has an off-angle of 0.2° or more but 2.0° or less in a perpendicular direction with respect to a direction in which the dislocation-concentrated regions extend, and of which an off-angle in a parallel direction with respect to the direction in which the dislocation-concentrated regions extend is equal to or less than the off-angle in the perpendicular direction, wherein the nitride semiconductor light-emitting device has, between the plurality of dislocation concentrated regions, a laser light guide region formed in the parallel direction, and wherein the nitride semiconductor light-emitting device is cut out of the nitride semiconductor wafer and has, as end surfaces of a cavity, cleavage planes perpendicular to the laser light guide region.

2. The nitride semiconductor light-emitting device according to claim 1, wherein a depression-like uniformly-light-emitting region that emits light with little unevenness is formed on a top surface of the nitride semiconductor substrate, and wherein a ridge-stripe portion or a narrowed-current portion is formed on a top surface of the uniformly-light-emitting region.

3. A nitride semiconductor light-emitting device comprising a plurality of nitride semiconductor layers disposed on top of a nitride semiconductor substrate, wherein the nitride semiconductor substrate is a GaN substrate having a high-luminescence region, the high-luminescence region having higher luminescence intensity than adjoining regions and having a boundary, wherein a top surface of the nitride semiconductor substrate has a C plane that is an off-angle of 0.2° or more but 2.0° or less in a perpendicular direction with respect to a direction in which the high-luminescence region extends and of which an off-angle in a parallel direction with respect to the direction in which the high-luminescence region extends is equal to or less than the off-angle in the perpendicular direction, wherein the nitride semiconductor light-emitting device has, between the high-luminescence region and another high-luminescence region, a laser light guide region formed in the parallel direction, and wherein the nitride semiconductor light-emitting device has, as end surfaces of a cavity, cleavage planes perpendicular to the laser light guide region.

4. The nitride semiconductor light-emitting device according to claim 3, wherein a depression-like uniformly-light-emitting region that emits light with little unevenness is formed on the top surface of the nitride semiconductor substrate, and wherein a ridge-stripe portion or a narrowed-current portion is formed on a top surface of the uniformly-light-emitting region.

5. A nitride semiconductor light-emitting device comprising a plurality of nitride semiconductor layers disposed on top of a nitride semiconductor substrate, wherein the nitride semiconductor substrate is a GaN substrate having, in a surface thereof on which the plurality of nitride semiconductor layers are disposed, a dislocation-concentrated region terminated with nitrogen and surrounded by a region, other than a dislocation-concentrated region, terminated with gallium, wherein a top surface of the nitride semiconductor substrate has a C plane that has an off-angle of 0.2° or more but 2.0° or less in a perpendicular direction with respect to a direction in which the dislocation-concentrated region extends and of which an off-angle in a parallel direction with respect to the direction in which the dislocation-concentrated region extends is equal to or less than the off-angle in the perpendicular direction, wherein the nitride semiconductor light-emitting device has, between the dislocation-concentrated region and another dislocation-concentrated region, a laser light guide region formed in the parallel direction, and wherein the nitride semiconductor light-emitting device has, as end surfaces of a cavity, cleavage planes perpendicular to the laser light guide region.

6. The nitride semiconductor light-emitting device according to claim 5, wherein a depression-like uniformly-light-emitting region that emits light with little unevenness is formed on a top surface of the nitride semiconductor substrate, and wherein a ridge-stripe portion or a narrowed-current portion is formed on a top surface of the uniformly-light-emitting region.

* * * * *